(12) United States Patent
Odoriba

(10) Patent No.: US 12,148,360 B2
(45) Date of Patent: Nov. 19, 2024

(54) INFORMATION DISPLAY DEVICE AND INFORMATION TERMINAL EQUIPPED WITH SAME

(71) Applicant: Panasonic Intellectual Property Management Co., Ltd., Osaka (JP)

(72) Inventor: Yuki Odoriba, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/200,671

(22) Filed: May 23, 2023

(65) Prior Publication Data

US 2024/0078964 A1 Mar. 7, 2024

Related U.S. Application Data

(60) Provisional application No. 63/349,631, filed on Jun. 7, 2022.

(51) Int. Cl.
G09G 3/32 (2016.01)
(52) U.S. Cl.
CPC .................................. *G09G 3/32* (2013.01)
(58) Field of Classification Search
CPC ........... G09G 3/32; G09F 13/08; G09F 19/12; G09F 19/22; G09F 13/044;

(Continued)

(56) References Cited

U.S. PATENT DOCUMENTS

2008/0203755 A1 8/2008 Bourgeois-Jacquet et al.
2012/0032201 A1 2/2012 Chou et al.
(Continued)

FOREIGN PATENT DOCUMENTS

DE 10 2020 122189 3/2022
JP 2002-213631 7/2002
(Continued)

OTHER PUBLICATIONS

Extended European search report issued Nov. 2, 2023 in European Patent Application No. 23173956.6.

*Primary Examiner* — Muhammad N Edun
(74) *Attorney, Agent, or Firm* — Wenderoth, Lind & Ponack, L.L.P.

(57) ABSTRACT

The information display device comprises a substrate portion, a light emitter, a housing, a display sheet, and a light guide region. The light emitter is disposed on the substrate portion and emits light. The housing is disposed so as to cover the substrate. The display sheet is attached to the housing, has a display surface on which various kinds of information are displayed by light emitted from the light emitter, and whose display surface is deformable. The light guide region is a space formed by the inner wall surface of the housing and the display sheet, and guides the light emitted from the light emitter to the display sheet. The housing has a deformable portion that is provided to at least the portion in contact with the display sheet, and that is more readily deformable than the substrate portion in a direction intersecting the surface of the display sheet. The housing and the display sheet deform along the wall surface with which the display sheet comes into contact.

11 Claims, 39 Drawing Sheets

(58) Field of Classification Search
CPC .. G09F 13/0468; G09F 13/0427; G09F 21/06;
G09F 27/005; H03K 17/962
See application file for complete search history.

(56) References Cited

U.S. PATENT DOCUMENTS

| | | | |
|---|---|---|---|
| 2018/0059318 A1* | 3/2018 | Nichol | G02B 6/0043 |
| 2018/0204884 A1* | 7/2018 | Isa | H05B 33/26 |
| 2020/0319497 A1 | 10/2020 | Matsumoto et al. | |
| 2022/0187871 A1* | 6/2022 | Yamazaki | G06F 1/3265 |

FOREIGN PATENT DOCUMENTS

| | | |
|---|---|---|
| JP | 2010-256769 | 11/2010 |
| JP | 2011-2579 | 1/2011 |

* cited by examiner

INFORMATION DISPLAY DEVICE AND INFORMATION TERMINAL EQUIPPED WITH SAME

BACKGROUND

Technical Field

The present disclosure relates to an information display device that displays various types of information, and to an information terminal equipped with the same.

Description of the Related Art

So-called stealth displays have been used in recent years, in which, in a non-display state, the normal wall surface is displayed on a wall surface near the seats of an aircraft, but in a display state, a video or an image in a specific shape is displayed for a user (such as the passengers of the aircraft).

SUMMARY

Problem to be Solved by the Disclosure

However, with a conventional display device used as a stealth display, a space may end up being created between the wall and the display device, resulting in blurring of the image and an inability to display a clear image. In particular, when the wall surface is a curved surface, a problem is that the image is more likely to be blurry because a space is more likely to be formed.

It is an object of the present disclosure to provide an information display device with which a clear image can be displayed regardless of the state of the wall surface with a display device installed in the wall surface near the seats of an aircraft, as well as an information terminal equipped with this information display device.

Means for Solving Problem

The information display device according to the present disclosure comprises a substrate portion, a light emitter, a housing, a display sheet, and a light guide region. The light emitter is disposed on the substrate portion and emits light. The housing is disposed so as to cover the substrate portion. The display sheet is attached to the housing, has a display surface on which various kinds of information are displayed by light emitted from the light emitter, and whose display surface is deformable. The light guide region is a space formed by the inner wall surface of the housing and the display sheet, and guides the light emitted from the light emitter to the display sheet. The housing has a deformable portion that is provided to at least the portion in contact with the display sheet, and that is more readily deformable than the substrate portion in a direction intersecting the surface of the display sheet. The housing and the display sheet deform along the wall surface with which the display sheet comes into contact.

Effects

With the information display device according to the present disclosure, a clear image can be displayed by a display device installed in the wall surface near the seats of an aircraft, regardless of the state of the wall surface.

DETAILED DESCRIPTION OF THE EMBODIMENT

Embodiments will now be described in detail with reference to the drawings as needed. However, some unnecessarily detailed description may be omitted. For example, detailed description of already known facts or redundant description of components that are substantially the same may be omitted. This is to avoid unnecessary repetition in the following description, and facilitate an understanding on the part of a person skilled in the art.

The applicant has provided the appended drawings and the following description so that a person skilled in the art might fully understand this disclosure, but does not intend for these to limit what is discussed in the patent claims.

Embodiment 1

An information terminal 10 comprising an information display device 20 according to an embodiment of the present disclosure will now be described with reference to FIGS. 1 to 14.

The information terminal 10 of this embodiment comprises a plurality of information display devices 20 as so-called stealth displays, with which the wall surface of an aircraft or the like, for example, looks like a normal wall in a non-display state, but in a display state, a video or an image of a specific shape is displayed for a user (such as passengers). The information terminal 10 will be described below by giving an example in which the information terminal 10 is installed on a wall surface provided near the seats of an aircraft having a specific rate of transmittance.

The information terminal 10 in this embodiment is installed, for example, inside a wall surface near the seats of the aircraft, and is provided in a state in which a plurality of information display devices 20 for displaying information to passengers of the aircraft are linked together.

Figure 1:
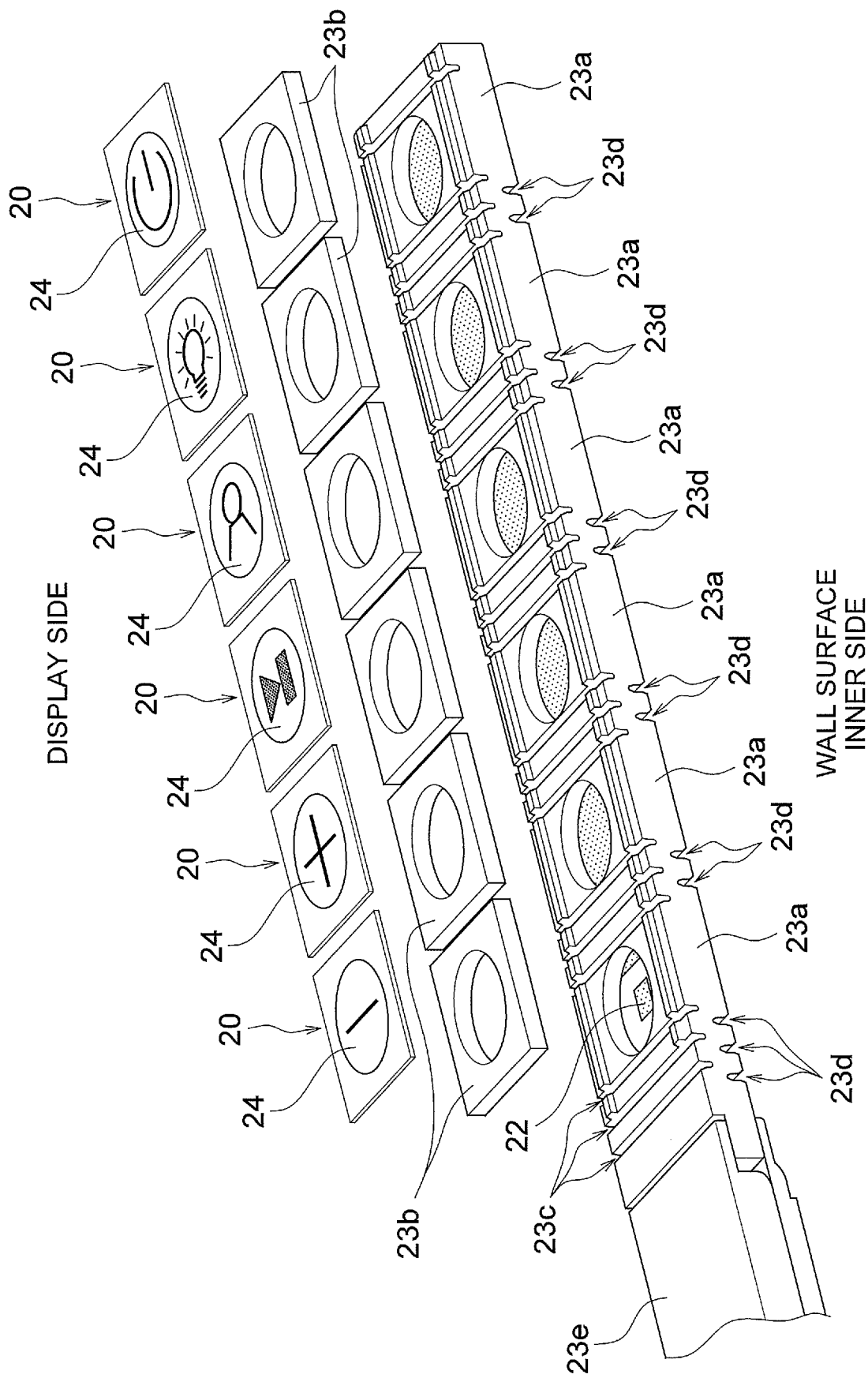
FIG. 1 is an overall oblique view of the configuration of an information terminal provided with the information display device according to an embodiment of the present disclosure.

As shown in FIG. 1, the plurality of information display devices 20 included in the information terminal 10 are provided with display sheets 24 that display a power button, a light, a call button, a play/stop button, a plus button, and a minus button on the display side surface, in that order starting from the right side in the drawing.

The display given by the display sheet 24 is achieved by emitting light from the light emitter 22 included in each information display device 20. That is, the information display devices 20 perform the desired display on a wall surface 30 (see FIG. 10, etc.) through the display sheets 24 when light is emitted from the light emitters 22, but when no light is being emitted from the light emitters 22, nothing is displayed on the wall surface 30, the state of which is the same as that of the surrounding wall surfaces 30.

Figure 2:
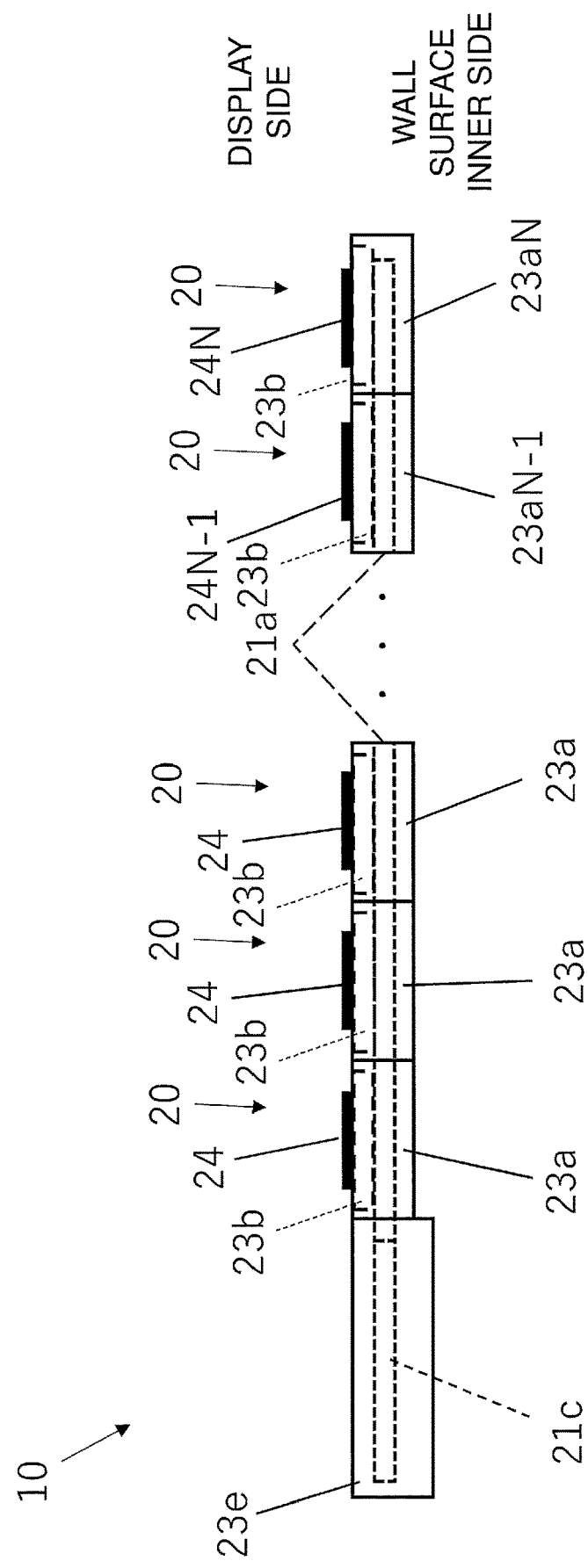
FIG. 2 is a side view of the configuration of the information terminal in FIG. 1.

FIG. 2 shows a side view of the information terminal 10 according to this Embodiment 1.

The information terminal 10 comprises the plurality of information display devices 20 (first housing 23*a*, second housing (deformable portion) 23*b*, display sheet 24, etc.), a control board 21*c*, and a case 23*e*.

The number of information display devices 20 included in the information terminal 10 is not limited to six as shown in FIG. 1, and may be any number, as shown in FIG. 2.

The control board 21*c* is provided in the case 23*e*, and a flexible board (substrate portion) 21*a* that is continuous from the inside of the case 23*e* to the plurality of information display devices 20 is built in.

The first housings 23*a* are substantially box-shaped and are connected to each other so that a plurality of information display devices 20 are linked. The first housings 23*a* each have a light emitter 22, etc. (discussed below) installed in its inner space. Also, a plurality of grooves (first grooves) 23*c* and grooves (second grooves) 23*d* are formed in the connecting portions between the first housings 23*a* of adjacent information display devices 20. Consequently, the connecting portions between the first housings 23*a* and the connecting portions between a first housing 23*a* and a case 23*e* can be bent in a direction intersecting the surface of the display sheet 24.

The second housing 23*b* is formed from an elastic material that is softer than the first housing 23*a*, and is disposed on the display-side surface of the first housing 23*a*.

Consequently, when the display sheet 24 is installed inside a curved wall surface, for example, the second housing 23*b* deforms so that the display sheet 24 (discussed below) can be brought into snug contact with the curved wall surface.

The display sheet 24 is attached to the second housing 23*b*, and has a display surface for displaying various information (power button, light, call, play/stop, plus and minus marks, etc.) with light emitted from the light emitter 22, and the display surface is deformable.

As shown in FIG. 2, the distance from the flexible substrate (substrate portion) 21a to the display sheet 24 in a direction intersecting the surface of the display sheet 24 is preferably greater than the distance from the flexible substrate (substrate portion) 21a to the end part of the light emitter 22. This prevents contact between the display sheet 24 and the light emitter 22 and reduces wear of the display sheet 24 when the display sheet 24 is brought into close contact with the curved wall surface.

The control board 21c has the function of controlling the light emitters 22 (such as LEDs (light emitting diodes)) mounted on the flexible substrate 21a or the control board 21c, sensors, and so on. These functions are not limited to the control board 21c, and may instead be provided on the flexible substrate 21a, or outside the information terminal 10.

Figure 3:
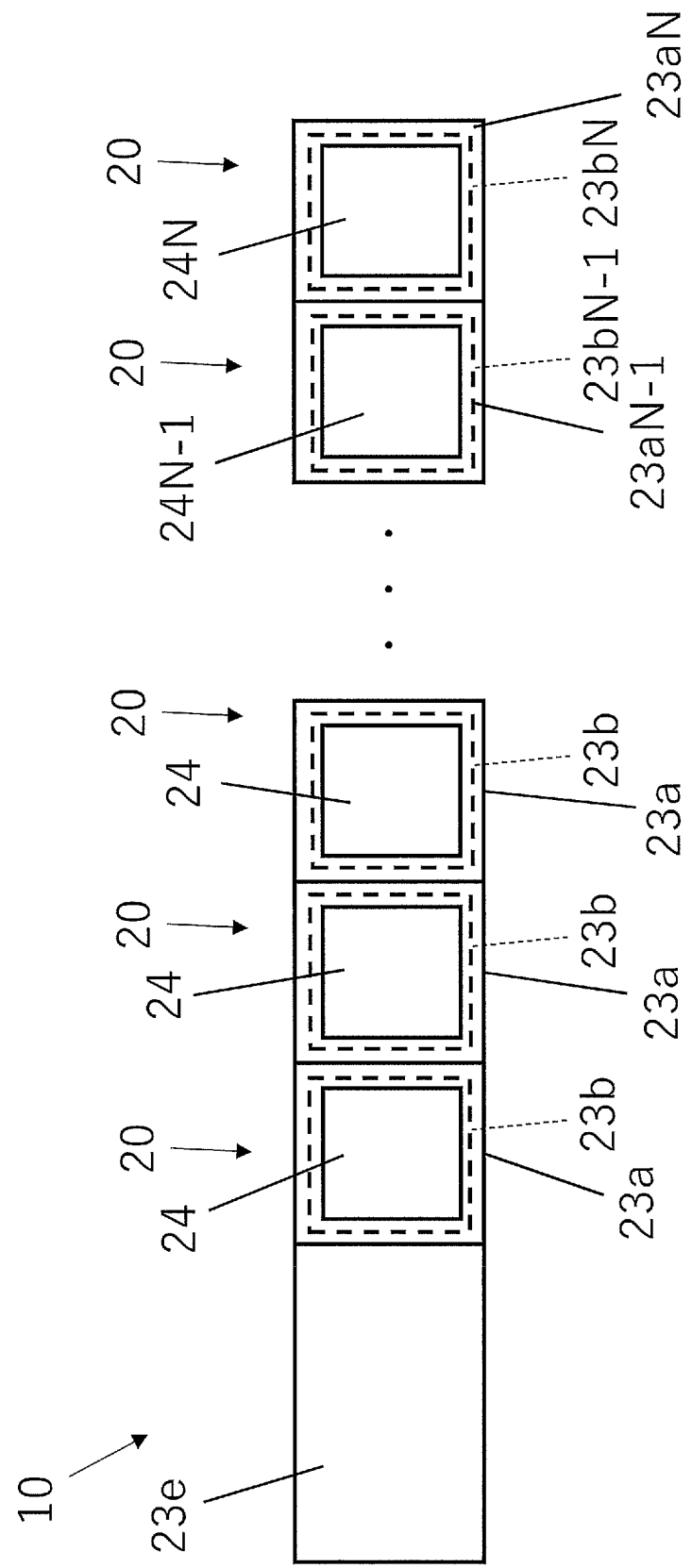
FIG. 3 is a top view of the information terminal in FIG. 2 as viewed from the display side.

FIG. 3 shows the configuration of the information terminal 10 of FIG. 2 as seen from above.

Each information display device 20 is provided with a light emitter 22 (display sheet 24). When the light emitter 22 emits light, the emitted light passes through the wall surface 30 (see FIG. 10, etc.), which has a specific transmittance, and the image drawn on the display sheet 24 is projected onto the wall surface 30.

The light emitters 22 do not need to be provided to all the information display devices 20, and may be provided only to some of the plurality of information display devices 20.

Figure 4:
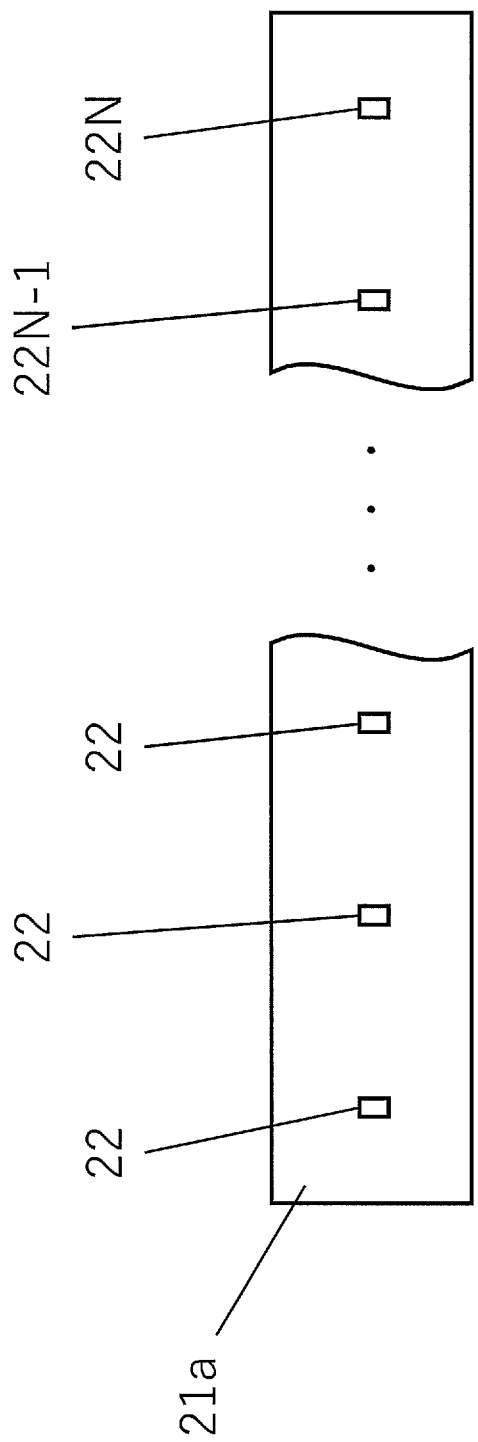
FIG. 4 is a plan view of the configuration on a flexible substrate installed inside the information terminal in FIG. 2.

FIG. 4 shows the flexible substrate 21a built into the information terminal 10.

LEDs or other such light emitters 22 are provided at positions corresponding to the various information display devices 20 on the flexible substrate 21a. Light emitted from the light emitters 22 passes through the display sheet 24 to display the pattern drawn on the display sheet 24. The light emitters 22 need not be provided to every one of the first housings 23a of the information display devices 20, and may be provided only to some of them.

Figure 5:
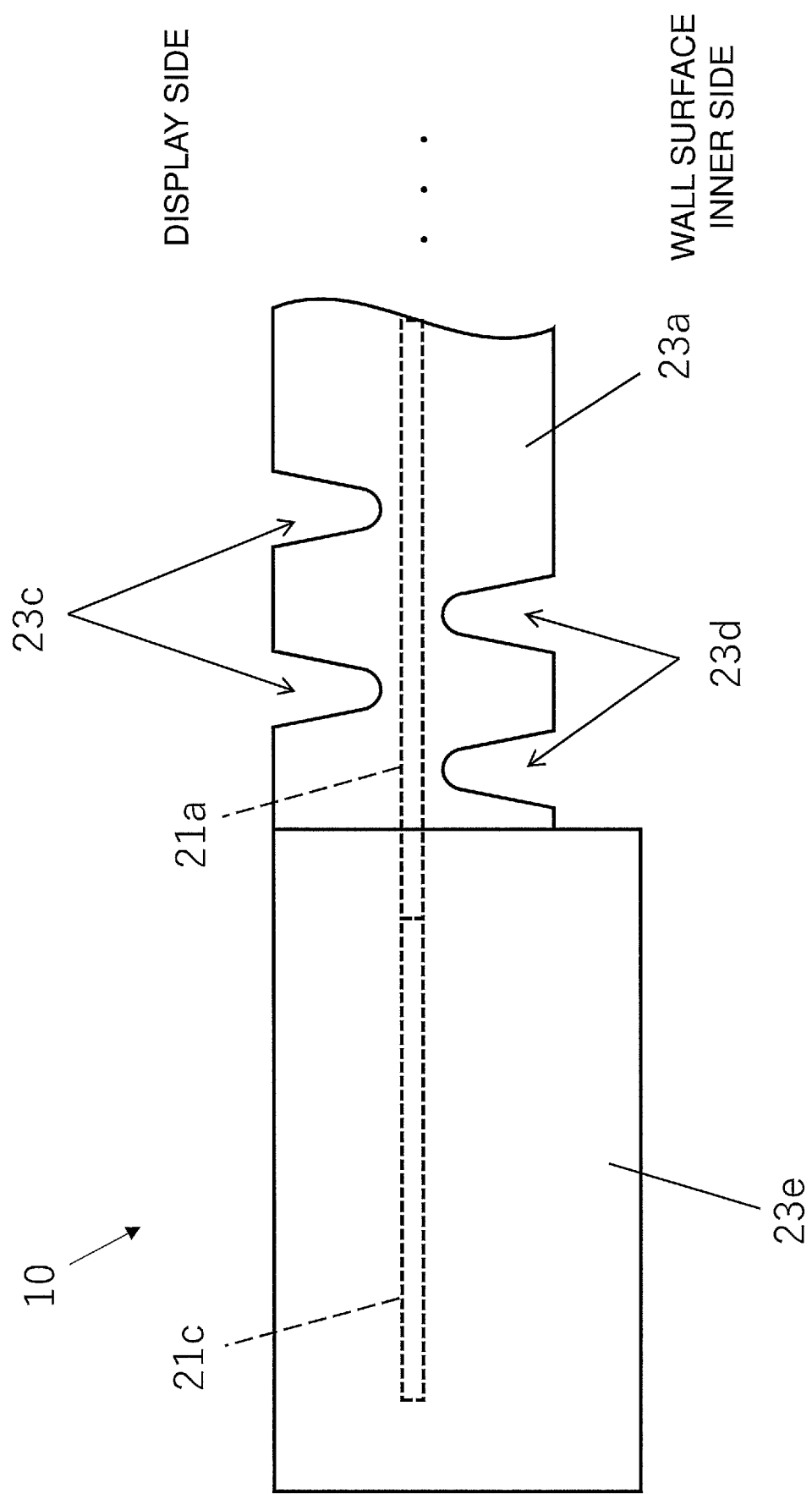
FIG. 5 is a side view of the configuration of the connecting portion between the housing and the case of the information terminal shown in FIG. 2.

FIG. 5 shows a detail side view of the connecting portion between the case 23e and the first housing 23a of the information display device 20 disposed adjacent to the case 23e.

In the connecting portions of the first housing 23a of an information display device 20, grooves 23c are provided to the surface on the display side, and grooves 23d are provided on the inner surface of the wall surface. Consequently, the first housing 23a around the grooves 23c and 23d deforms more easily than the information display device 20, so just the connecting portions can be bent.

The grooves 23c and 23d are provided on the display side of the connecting portion and on the opposite side from the display side, respectively, which allows bending with the flexible substrate 21a as the center of that bending.

The grooves 23c and 23d are not limited in number or position, so long as they are disposed around the connecting portion. The number and position of the grooves 23c and 23d provided to the connecting portion may be different from one first housing 23a to the next.

However, as shown in FIG. 5, if the grooves 23c and 23d are disposed at positions that are offset from each other on the display-side surface and the inner surface of the wall surface when viewed from the side, this avoids a decrease in strength by eliminating places where the first housing 23a is substantially thinner.

Figure 6:
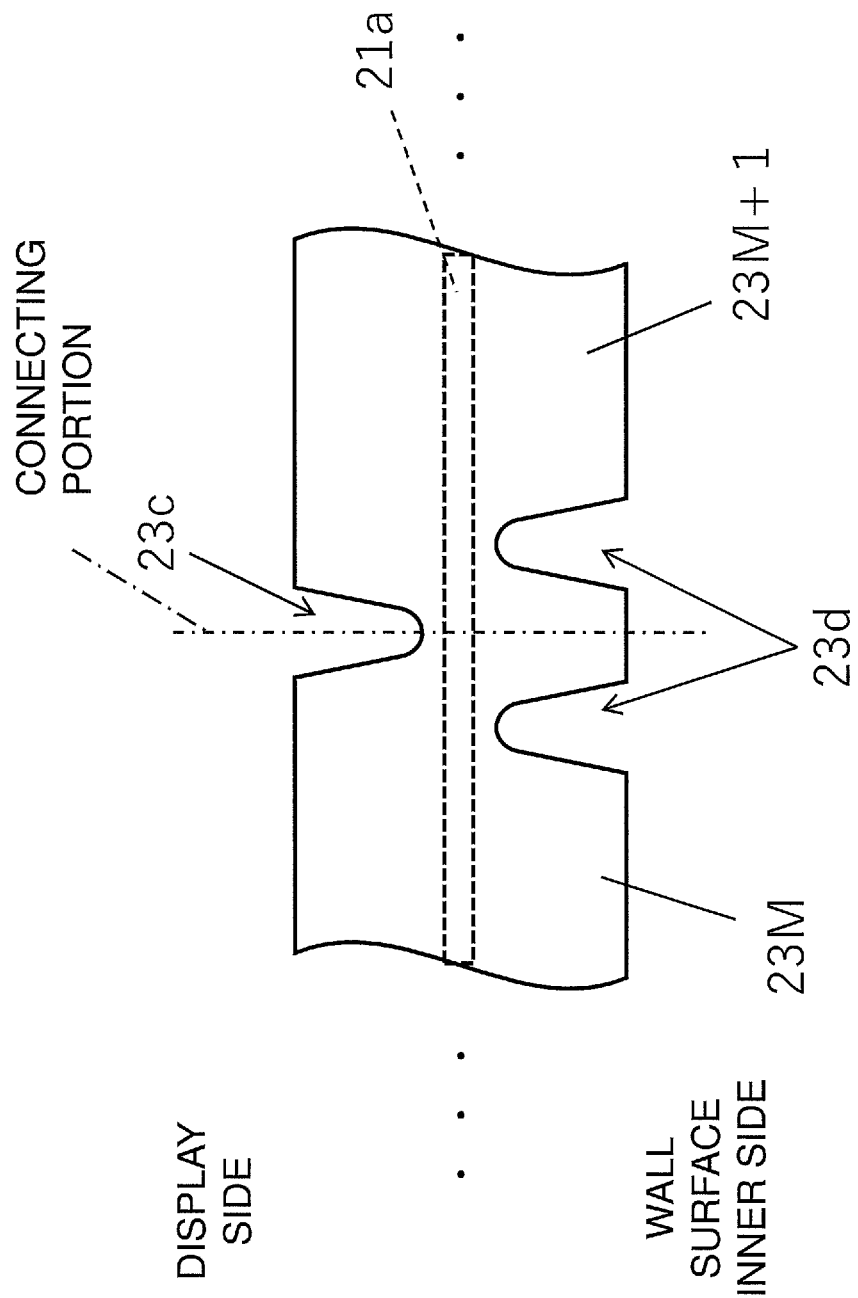
FIG. 6 is a side view of the configuration of the connecting portion between housings in an information display device constituting the information terminal in FIG. 2.

FIG. 6 shows a detail side view of the connecting portion between two first housings 23a.

The grooves 23c and 23d are provided to the connecting portions of first housings 23a and 23a that are adjacent to each other. This allows the first housing 23a around the grooves 23c and 23d to deform more easily than the information display device 20, and allows just the connecting portion to be bent.

Also, because the grooves 23c and 23d are provided on the display side of the connecting portion and on the inner side of the wall surface, respectively, bending is possible with the flexible substrate 21a serving as the center of the bending. When the information terminal 10 is installed on a curved wall surface 30 (discussed below), the first housing 23a portions can also be bent to conform to the curved wall surface 30.

Just as with the connecting portion between the case 23e and the first housing 23a, the grooves 23c and 23d are not limited in number or position, so long as they are disposed around the connecting portion.

However, as shown in FIG. 6, if the grooves 23c and 23d are disposed at positions that are offset from each other on the display-side surface and on the inner surface of the wall surface when viewed from the side, this avoids a decrease in strength by eliminating places where the first housing 23a is substantially thinner.

As discussed above, with the information terminal 10 in this embodiment, the grooves 23c and 23d are provided to the first housing 23a at the connecting portions between the information display devices 20.

Consequently, the mechanical strength is decreased, and the connecting portion can be made more flexible than at least other portions of the first housing 23a. This means that when a force is exerted on the information terminal 10, only the connecting portion will be deformed.

Also, as shown in FIG. 6, the grooves 23c and 23d are provided on the display side and on the inside of the wall surface with respect to the flexible substrate 21a in the first housing 23a.

As a result, the information terminal 10 can be deformed with the flexible substrate 21a serving as the center of this deformation.

The number of grooves 23c and 23d may be at least one on the display side and at least one on the inner side of the wall surface with respect to the flexible substrate 21a. Also, the grooves 23c on the display side and the grooves 23d on the inner side of the wall surface are preferably disposed at positions that are offset from each other in side view. This avoids the local concentration of force on the first housing 23a due to deformation of the information terminal 10.

Figure 7:
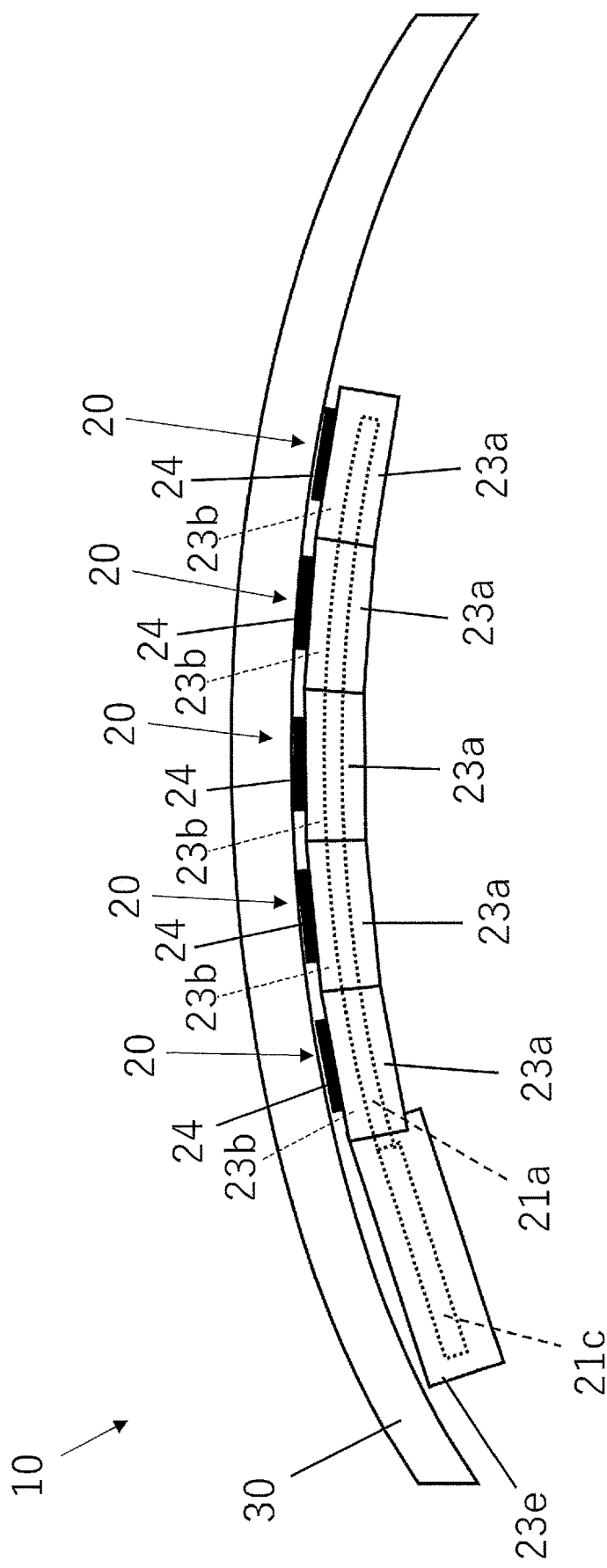
FIG. 7 is a diagram showing an example in which the information terminal in FIG. 2 is disposed on a curved wall with a convex shape.
Figure 8:
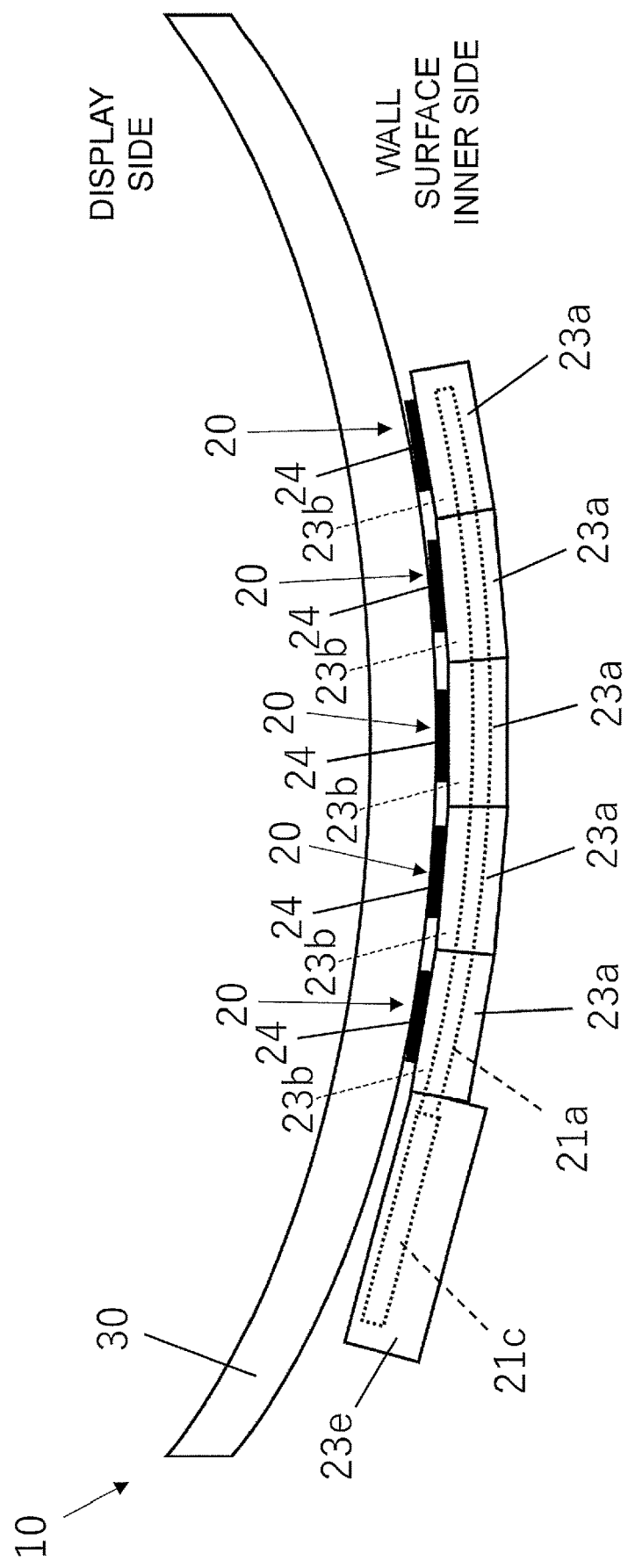
FIG. 8 is a diagram showing an example in which the information terminal in FIG. 2 is disposed on a curved wall with a concave shape.

FIGS. 7 and 8 show diagrams in which the information terminal 10 is disposed on the curved wall surface 30.

With the information terminal 10 in this embodiment, as discussed above, the connecting portions between the first housings 23a adjacent to each other and between the first housing 23a and the case 23e are bent, and the display sheet 24 and the second housings 23b are flexible. The flexibility of the flexible substrate 21a built into the information terminal 10 allows it also to bend so as to match the bending of the first housing 23a and the case 23e.

Consequently, as shown in FIGS. 7 and 8, the various information display devices 20 are disposed so as to conform to the wall surface 30 without any gaps, which allows a sharp image to be displayed regardless of the state of the wall surface. Also, the curvature of the wall surface 30 can be set as desired, and the information terminal 10 will take up less space on the inside of the wall surface 30.

Figure 9:
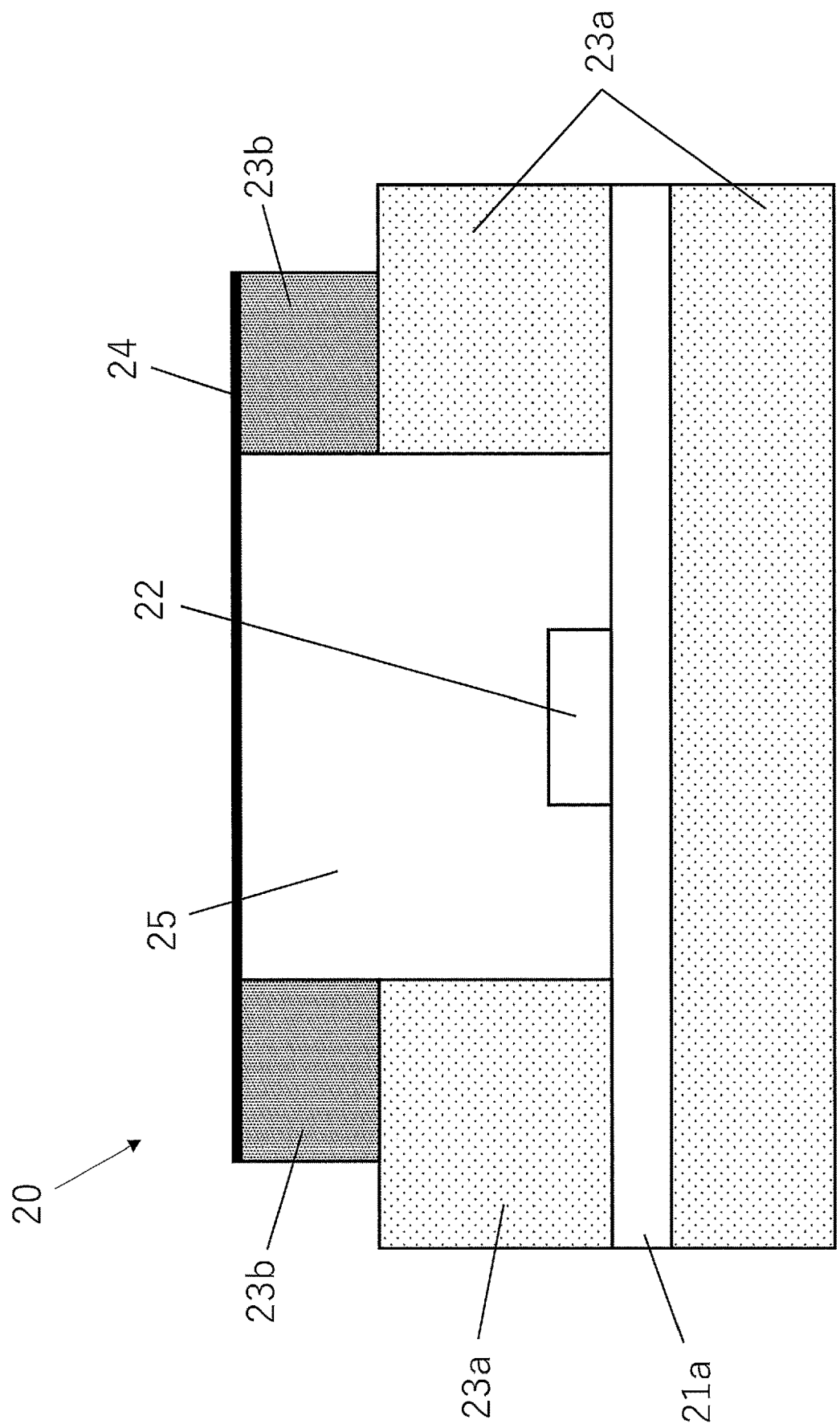
FIG. 9 is a cross-sectional view of the configuration of an information display device constituting the information terminal in FIG. 2.

FIG. 9 is a cross-sectional view of the configuration of the plurality of information display devices 20 included in the information terminal 10.

As shown in FIG. 9, an information display device 20 includes a flexible substrate 21a, a first housing 23a, a second housing 23b, and a light emitter 22 disposed on the flexible substrate 21a inside the first housing 23a, a display sheet 24, and a light guide region 25.

As shown in FIG. 9, the first housing 23a has a substantially box-like shape, and the light emitter 22 is disposed on the flexible substrate 21a in the internal space.

The light emitter 22 emits light upward in the drawing, thereby displaying the pattern drawn on the display sheet 24 on the display side through the display sheet 24.

As shown in FIG. 9, the second housing 23b is a cushioning material disposed between the upper end surface of the first housing 23a and the display sheet 24, and is formed from a material that is softer than the flexible substrate 21a. That is, the second housing 23b is configured to deform more easily in a direction intersecting the surface of the display sheet 24 than the flexible substrate 21a.

The display sheet 24 is a sheet-like member whose display surface is deformable, is attached to the display-side surface of the second housing 23b, and has a display surface that displays any of various kinds of information by means of the light emitted from the light emitter 22.

The light guide region 25 is a space formed by the inner wall surface of the first housing 23a and the display sheet 24, and guides the light emitted from the light emitter 22 to the display sheet 24.

Figure 10:
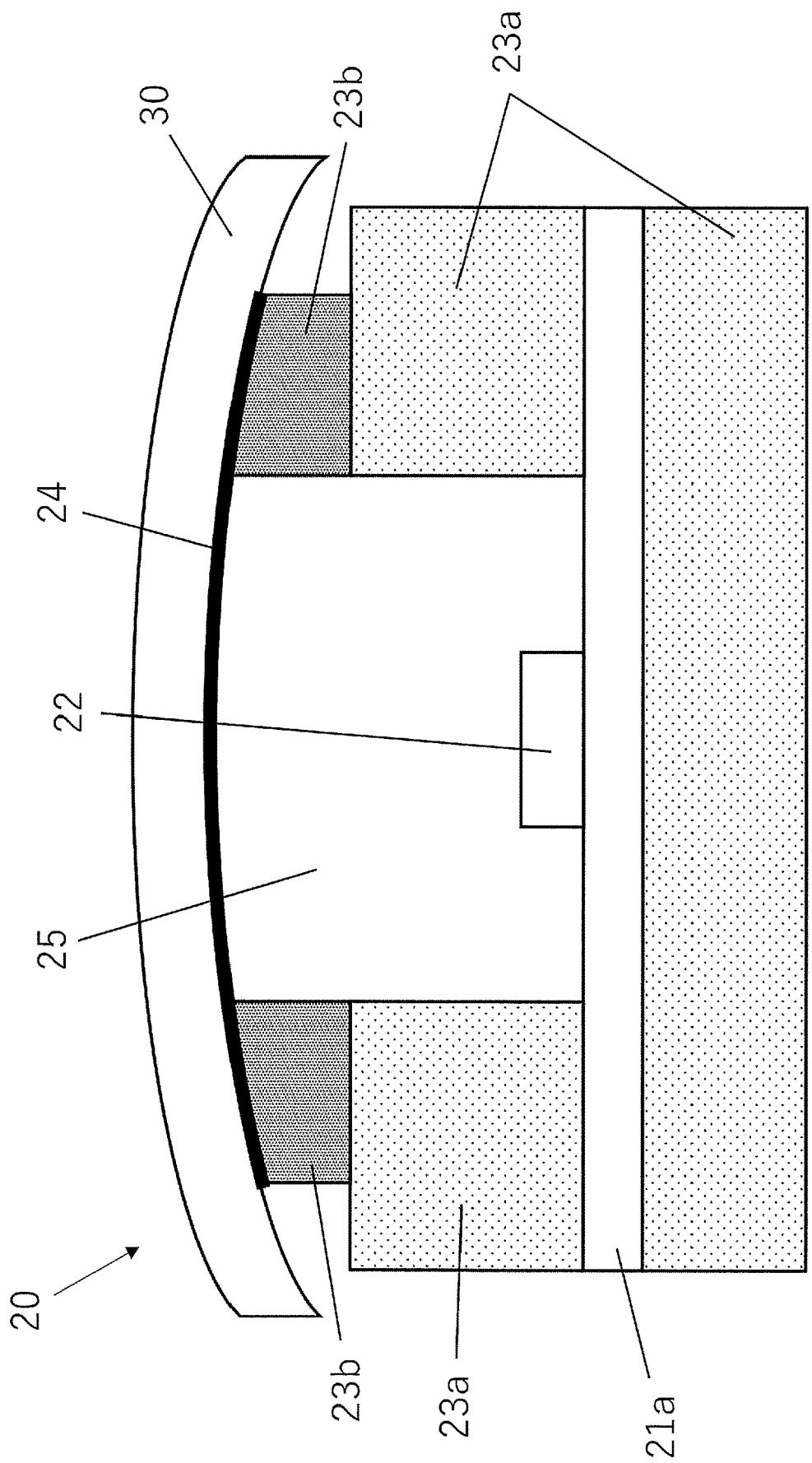
FIG. 10 is a cross-sectional view showing a state in which the information display device in FIG. 9 is disposed on a curved wall with a convex shape.
Figure 11:
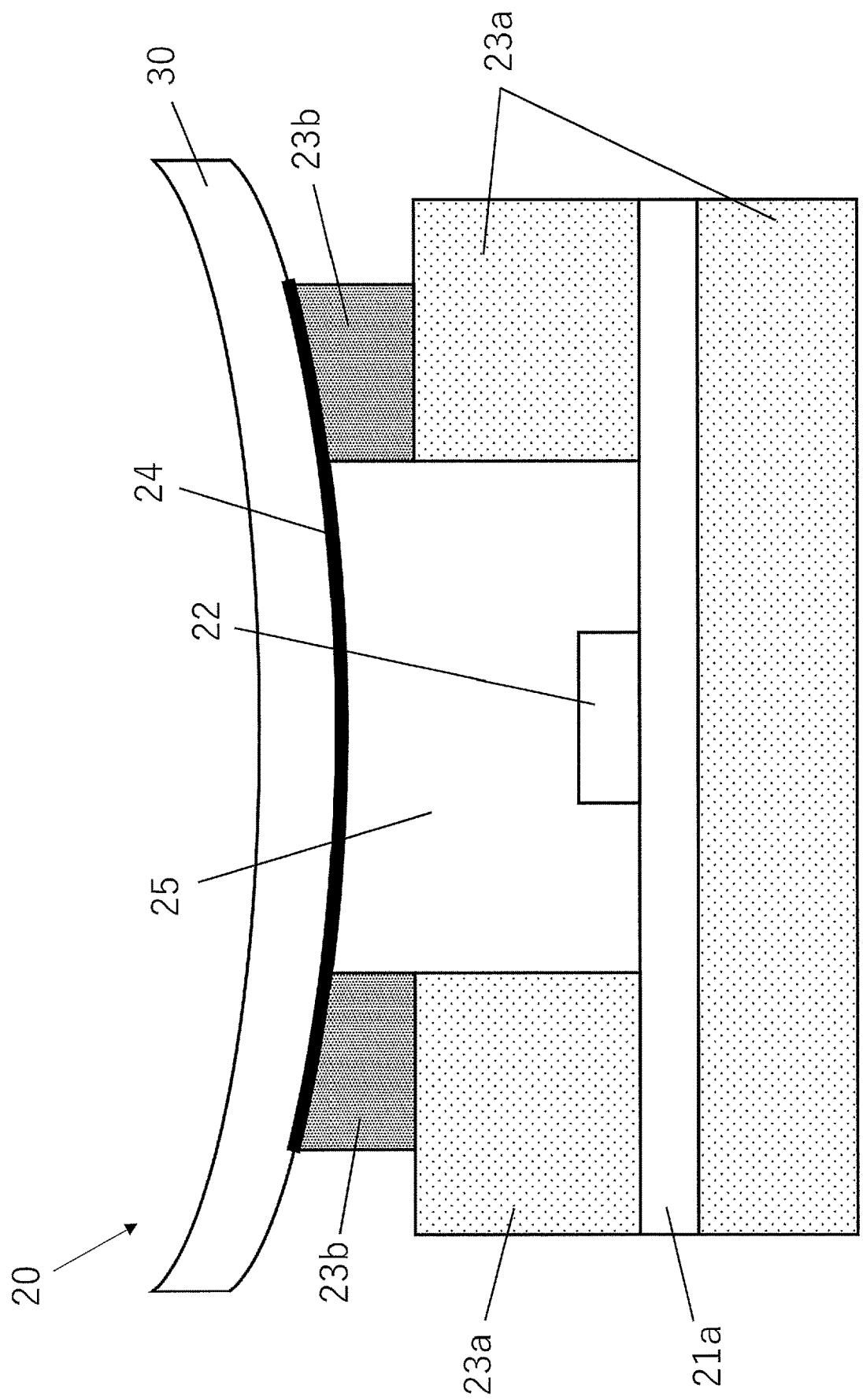
FIG. 11 is a cross-sectional view showing a state in which the information display device in FIG. 9 is disposed on a curved wall with a concave shape.

FIGS. 10 and 11 are cross-sectional views of a state in which the information display device 20 shown in FIG. 9 has been disposed inside the curved wall surface 30.

The display sheet 24 and the second housing 23b, which are disposed in contact with the curved wall surface 30, deform so as to conform to the wall surface 30, as shown in FIGS. 10 and 11.

As a result, there is no space between the display surface of the information display device 20 and the wall surface 30, and a sharp image corresponding to the display sheet 24 can be displayed on the wall surface 30.

Figure 12:
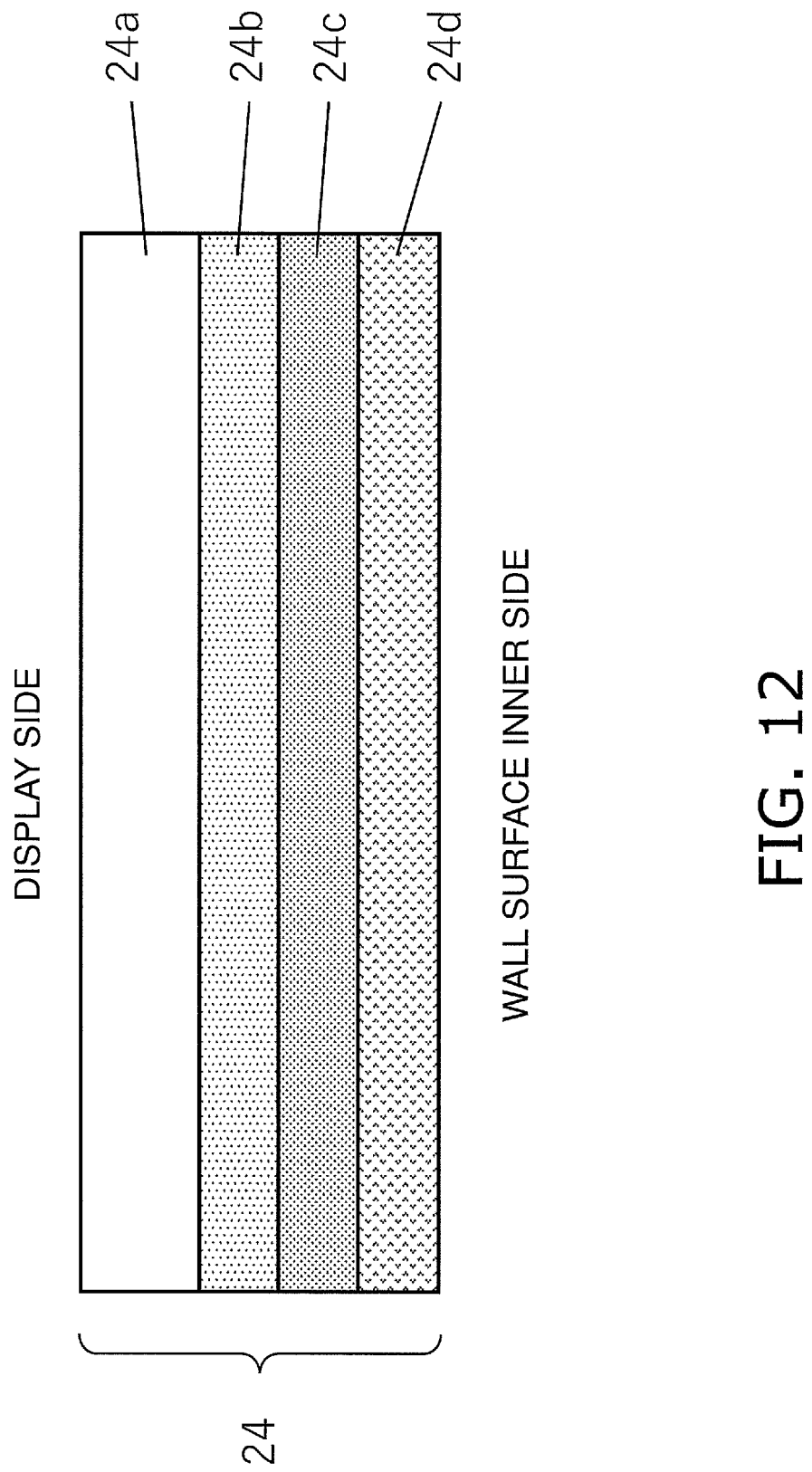
FIG. 12 is a cross-sectional view of the configuration of the display sheet included in the information display device in FIG. 9.

FIG. 12 shows the configuration of the display sheet 24.

The display sheet 24 has the desired pattern formed on its surface as mentioned above, and transmits only the light having the shape of the image that is to be displayed on the wall surface 30, thereby displaying an image corresponding to the display sheet on the wall surface 30.

As shown in FIG. 12, the display sheet 24 has, in the following order starting from the display side, a substrate 24a that transmits a specific proportion of light, and a colored layer 24b that displays a color on the substrate 24a and transmits a specific proportion of light, a light blocking layer 24c that blocks light in the shape of the image to be displayed on the wall surface 30, and a diffusion layer 24d that diffuses light incident on the light blocking layer 24c and transmits a specific proportion of light.

It is possible for the substrate 24a to be formed from a transparent material, but the substrate 24a may be colored so that a specific proportion of light will be transmitted, and as such may serve in place of the colored layer 24b.

The colored layer 24b, the light blocking layer 24c, and the diffusion layer 24d deform so as to conform to the deformation of the substrate 24a of the display sheet 24. The colored layer 24b, the light blocking layer 24c, and the diffusion layer 24d may be configured to include a plurality of layers.

It is possible for the light blocking layer 24c to be painted black, silver, or a combination of these. It is possible for the diffusion layer 24d to be painted white.

If the substrate 24a is transparent and there is no colored layer 24b, there will be a stark difference in color contrast between the light blocking layer 24c and the diffusion layer 24d, and it is conceivable that the image shape of the light blocking layer 24c will end up being visible through the wall surface 30 even when the light emitter 22 is not emitting any light.

However, in this embodiment, since the display sheet 24 includes the colored layer 24b, the difference in contrast is greatly reduced, and transmission of the image shape of the light blocking layer 24c to the wall surface 30 when the light emitter 22 is not emitting light can be made less conspicuous.

Figure 13:
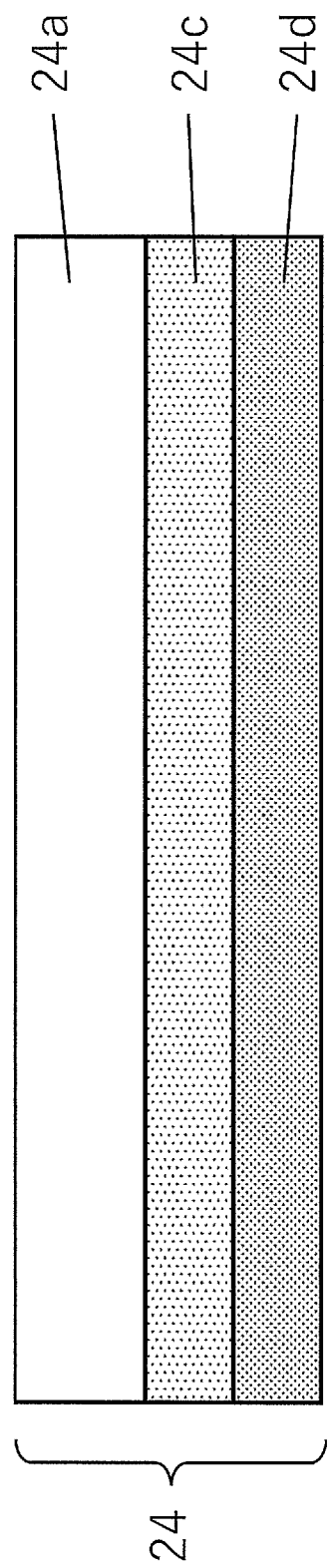
FIG. 13 is a cross-sectional view showing another example of the configuration of the display sheet in FIG. 12.

As shown in FIG. 13, the display sheet 24 may be configured not to comprise the colored layer 24b (having only the substrate 24a, the light blocking layer 24c, and the diffusion layer 24d).

Figure 14:
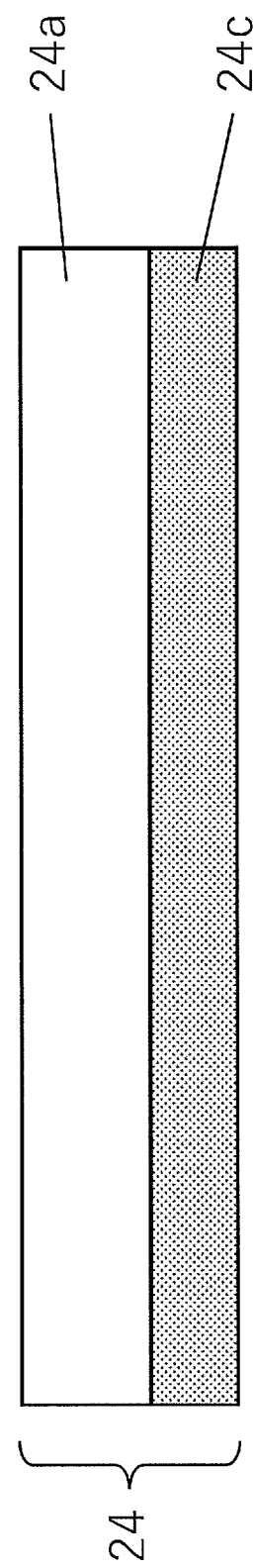
FIG. 14 is a cross-sectional view showing yet another example of the configuration of the display sheet in FIG. 12.

Furthermore, as shown in FIG. 14, the display sheet 24 may have a configuration that does not include the colored layer 24b or the diffusion layer 24d (having only the substrate 24a and the light blocking layer 24c).

Embodiment 2

The information display device 120 according to another embodiment of the present disclosure will now be described with reference to FIGS. 15 to 17.

Figure 15:
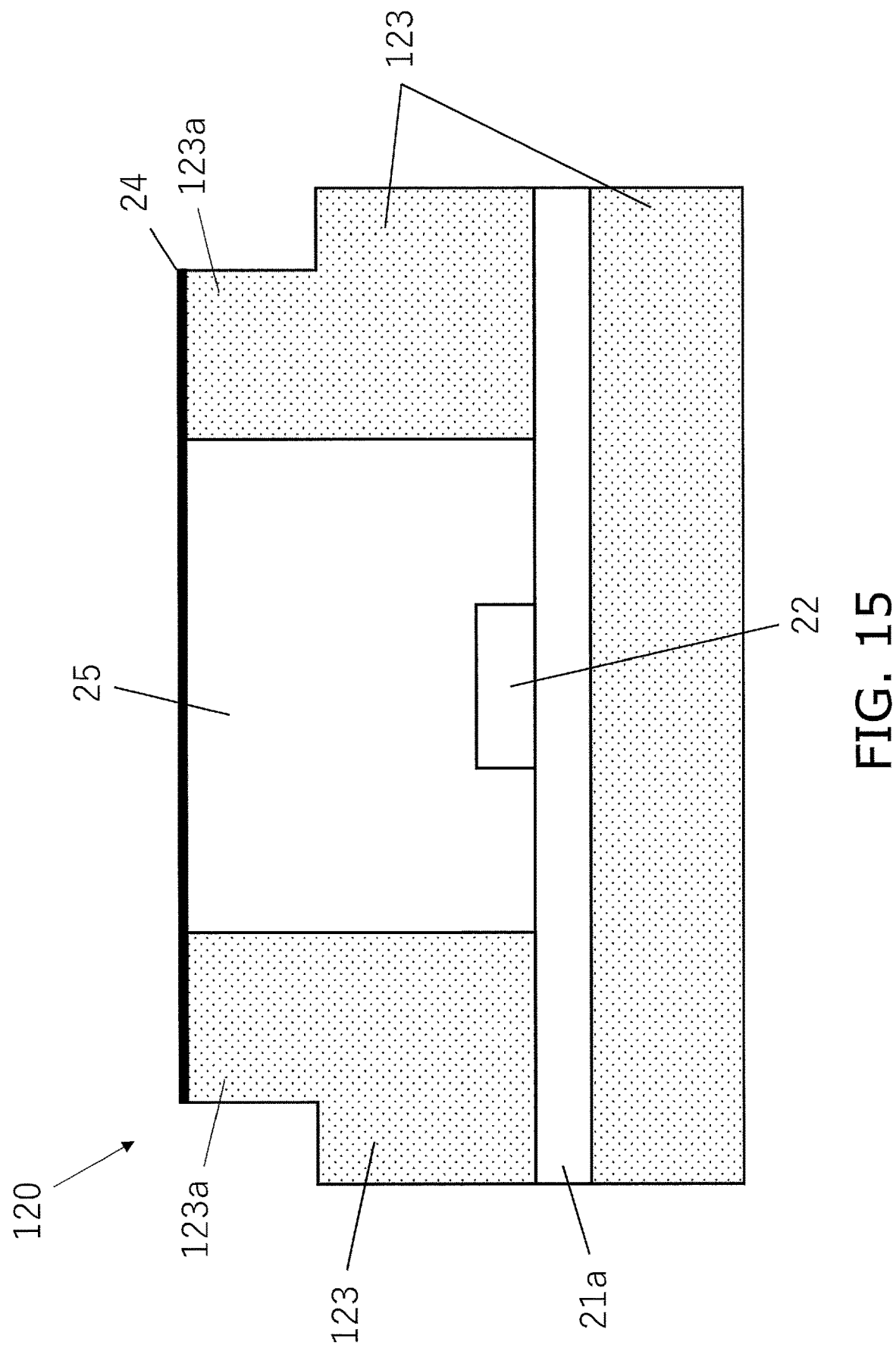
FIG. 15 is a cross-sectional view of the configuration of the information display device according to another embodiment of the present disclosure.

As shown in FIG. 15, the information display device 120 of this embodiment differs from Embodiment 1 in that the first housing 23a and the second housing 23b of Embodiment 1 are constituted by a single housing 123.

However, the configuration other than the above is basically the same as that of Embodiment 1, so components having the same function and shape as those described in Embodiment 1 shall be numbered the same and shall not be described in detail again.

As shown in FIG. 15, the information display device 120 of this embodiment comprises the flexible substrate 21a, the light emitter 22, the housing 123, the display sheet 24, and the light guide region 25.

The housing 123 has a deformable portion 123a formed from a material that is softer than at least the flexible substrate 21a, in the portion that comes into contact with the display sheet 24. That is, the deformable portion 123a is configured to deform more readily in a direction intersecting the surface of the display sheet 24 than does the flexible substrate 21a.

The deformable portion 123a is a part of the housing 123 and deforms along with the flexible display sheet 24. The deformable portion 123a of the housing 123 is formed thicker than the flexible substrate 21a.

Figure 16:
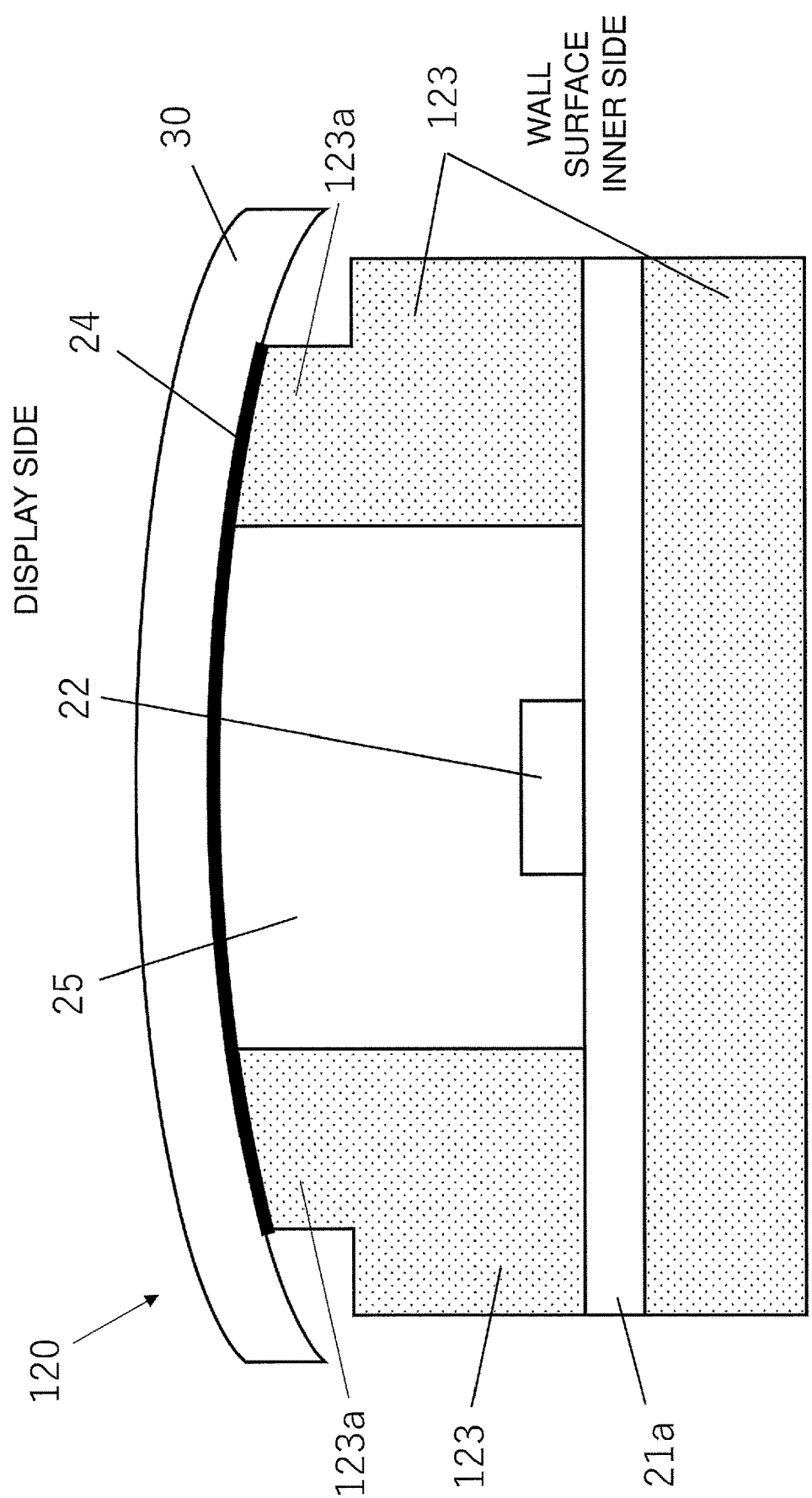
FIG. 16 is a cross-sectional view showing a state in which the information display device in FIG. 15 is disposed on a curved wall with a convex shape.
Figure 17:
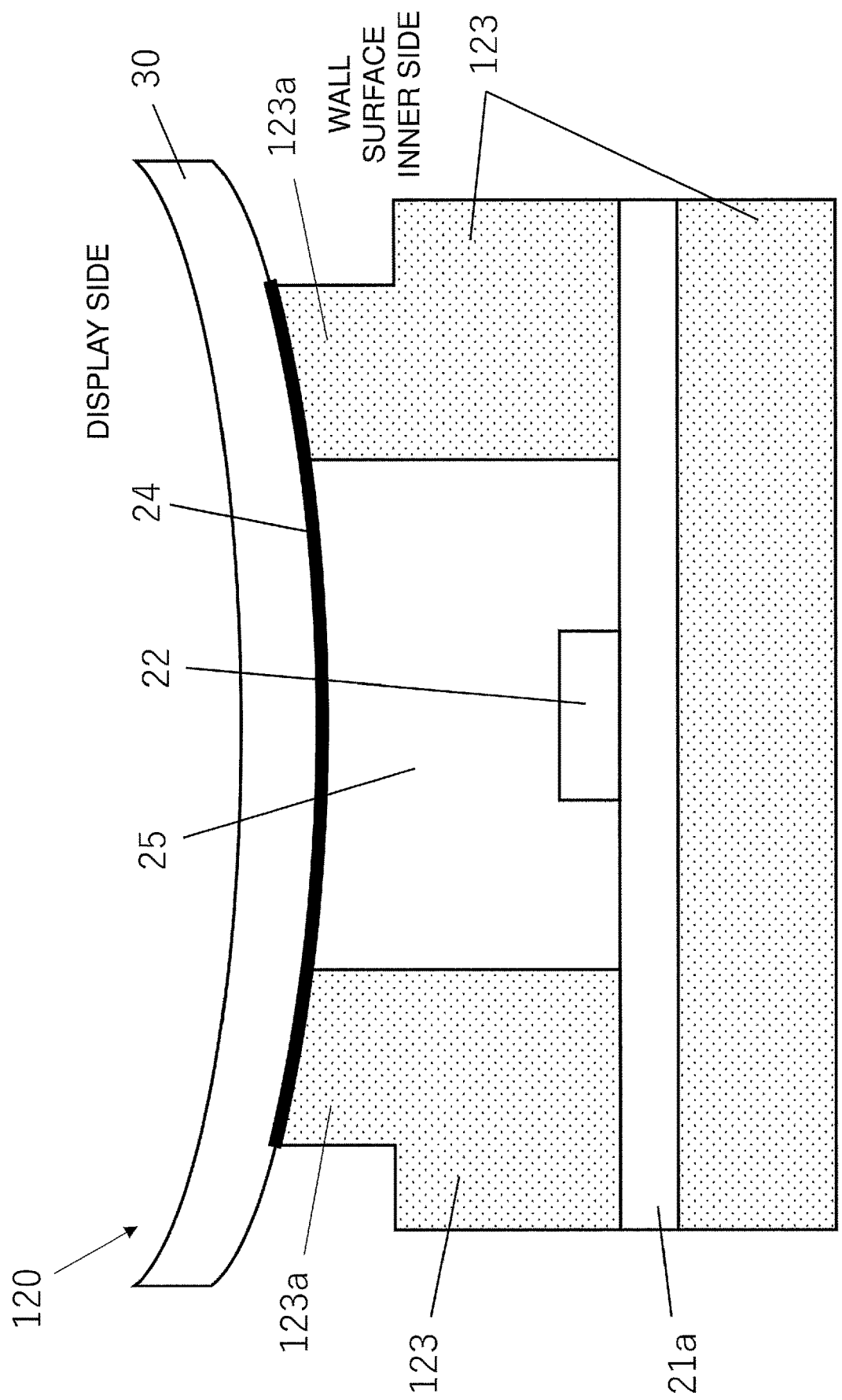
FIG. 17 is a cross-sectional view showing a state in which the information display device in FIG. 15 is disposed on a curved wall with a concave shape.

FIGS. 16 and 17 are cross-sectional views of a state in which the information display device 120 shown in FIG. 15 is disposed inside the curved wall surface 30.

The display sheet 24 and the deformable portion 123a of the housing 123, which are disposed in contact with the curved wall surface 30, deform so as to conform to the wall surface 30, as shown in FIGS. 16 and 17.

Consequently, just as with the information display device 20 of Embodiment 1, there is no space between the information display device 120 and the wall surface 30, and a sharp image corresponding to the display sheet 24 can be displayed on the wall surface 30.

That is, forming at least the portion of the single housing 123 that makes contact with the display sheet 24 from a material that is softer than the flexible substrate 21a provides the same effect as with the information display device 20 of Embodiment 1. That is, the portion of the housing 123 that makes contact with the display sheet 24 is configured deform more readily in a direction intersecting the surface of the display sheet 24 than does the flexible substrate 21a.

Embodiment 3

The information display device 220 according to yet another embodiment of the present disclosure will now be described with reference to FIG. 18.

Figure 18:
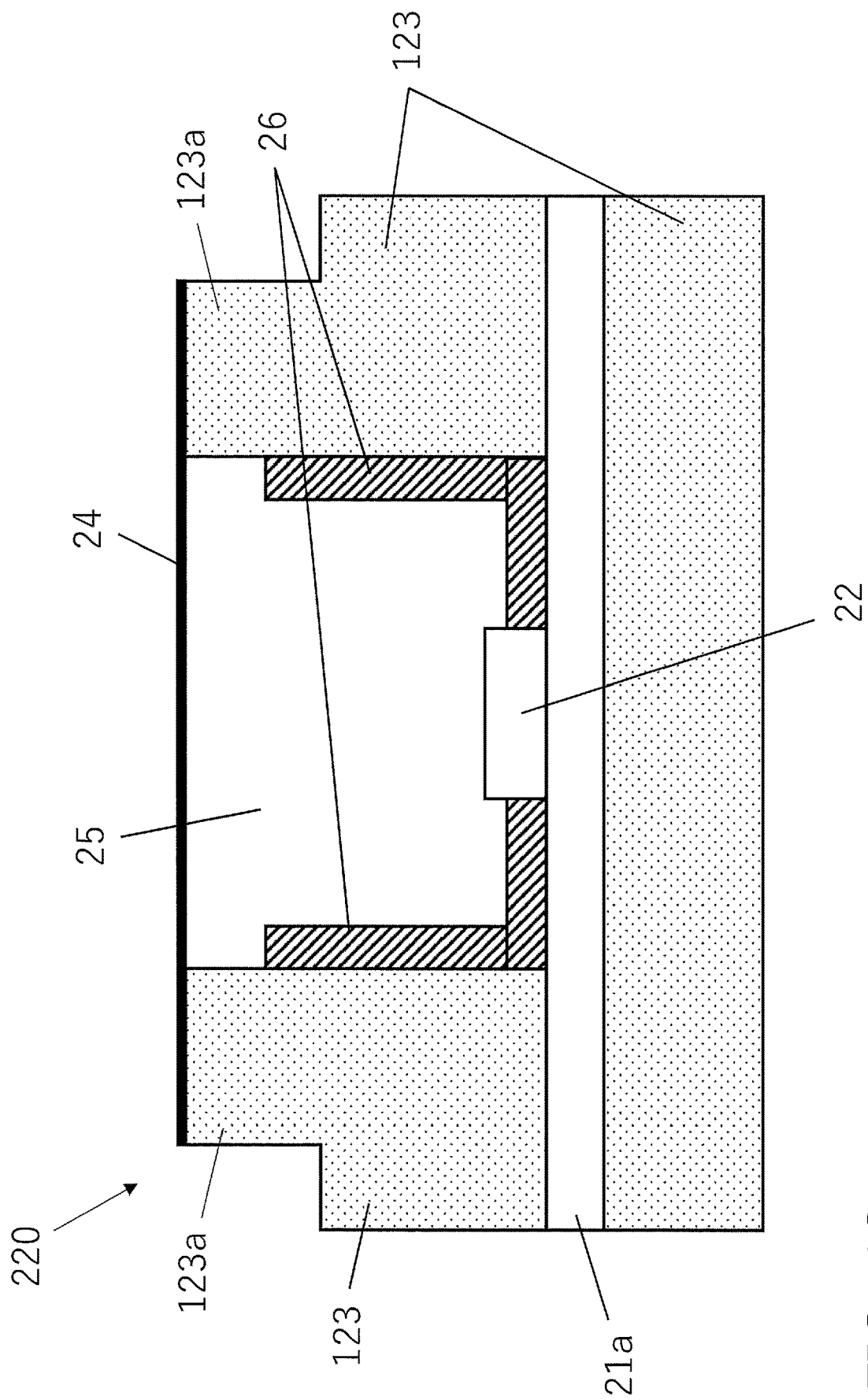
FIG. 18 is a cross-sectional view of the configuration of the information display device according to yet another embodiment of the present disclosure.

As shown in FIG. 18, the information display device 220 of this embodiment differs from Embodiment 2 in that a reflective material 26 is disposed in the light guide region 25 in the housing 123 of Embodiment 2.

However, the configuration other than the above is basically the same as that of Embodiments 1 and 2, so components having the same function and shape as those described in Embodiments 1 and 2 shall be numbered the same and shall not be described in detail again.

As shown in FIG. 18, the information display device 220 of this embodiment is provided with a reflective material 26 that reflects the light emitted from the light emitter 22 inside the housing 123, that is, in the light guide region 25.

Here, the reflective material 26 may be a reflector, or may be a white-painted or white sheet.

Since the reflective material 26 thus surrounds the outside of the light emitter 22, the light is reflected and diffused in the light guide region inside the housing 123, and the intensity of the light incident on the display sheet 24 can be made more uniform.

This allows an image in which the light is very uniform to be displayed on the wall surface.

The diffusion layer 24d provided on the light emitter 22 side of the display sheet 24 can also be used as part of the reflective material.

Embodiment 4

The information display device 320 according to yet another embodiment of the present disclosure will now be described with reference to FIG. 19.

Figure 19:
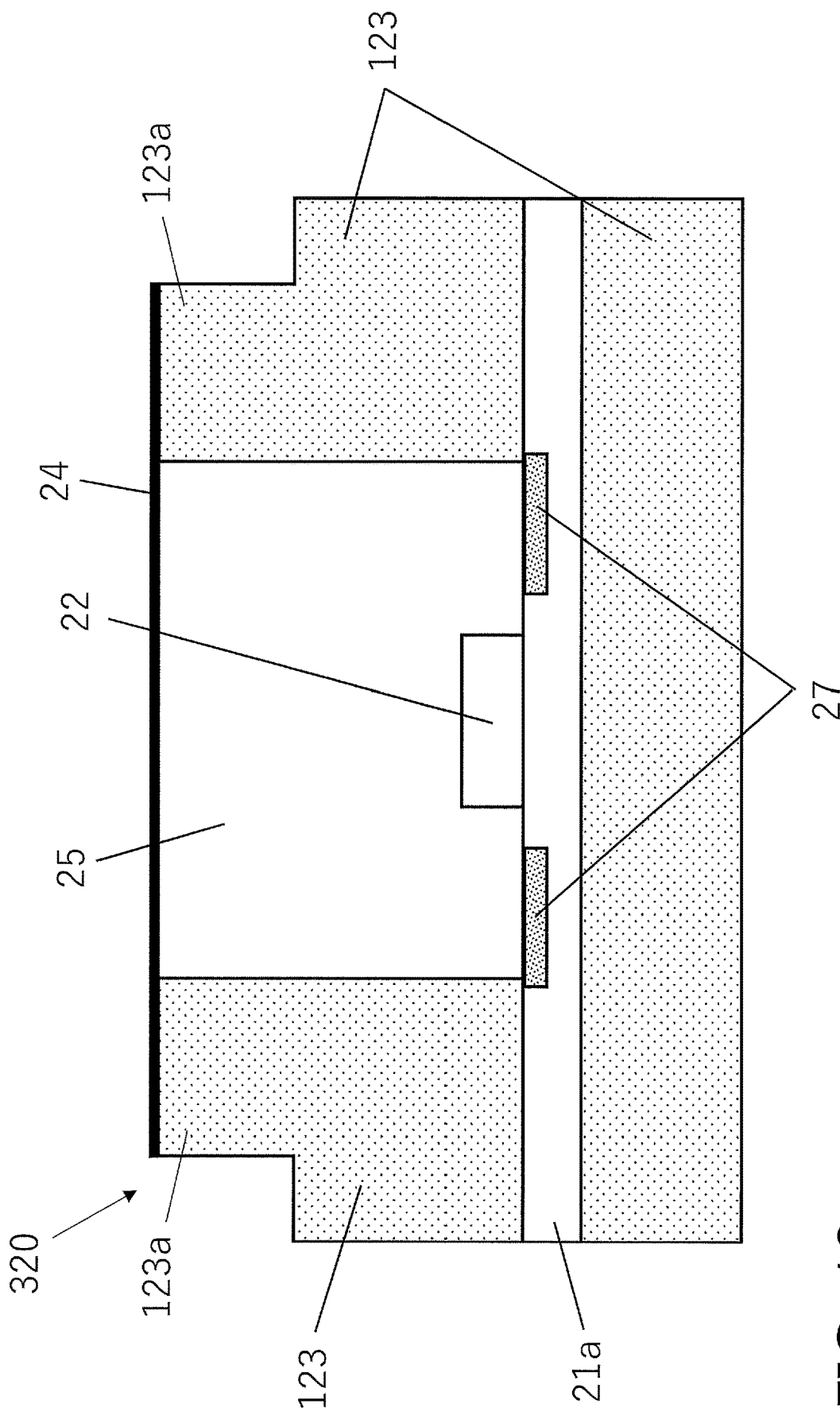
FIG. 19 is a cross-sectional view of the configuration of the information display device according to yet another embodiment of the present disclosure.

As shown in FIG. 19, the information display device 320 of this embodiment differs from that of Embodiment 2 in that a sensor 27 is disposed on the flexible substrate 21a of Embodiment 2.

However, the configuration other than the above is basically the same as that of Embodiments 1 and 2, so components having the same function and shape as those described in Embodiments 1 and 2 shall be numbered the same and shall not be described in detail again.

FIG. 19 shows a layout example of the electrodes of the sensor 27 disposed on the flexible substrate 21a.

As shown in FIG. 19, the information display device 320 of this embodiment is provided with a sensor 27 that detects that a finger or the like on or near the surface of the display sheet 24 from changes in capacitance, this sensor being provided at a position facing the light guide region 25 on the flexible substrate 21a.

The electrodes of the sensor 27 are disposed around the light emitter 22, and upon coming into contact with the housing 123, detect a change in capacitance around the display sheet 24 projecting a pattern on the wall surface 30 through the display sheet 24 and the housing 123.

The sensor 27 senses, via its electrodes, that the hand of a passenger or the like has moved near the wall surface 30 on which the display sheet 24 is disposed. The sensor 27 can deform along with the display sheet 24 and the housing 123 to conform to the wall surface 30.

This makes it possible to detect an operation or input by a passenger or other person on the surface of the display sheet 24.

Figure 20:
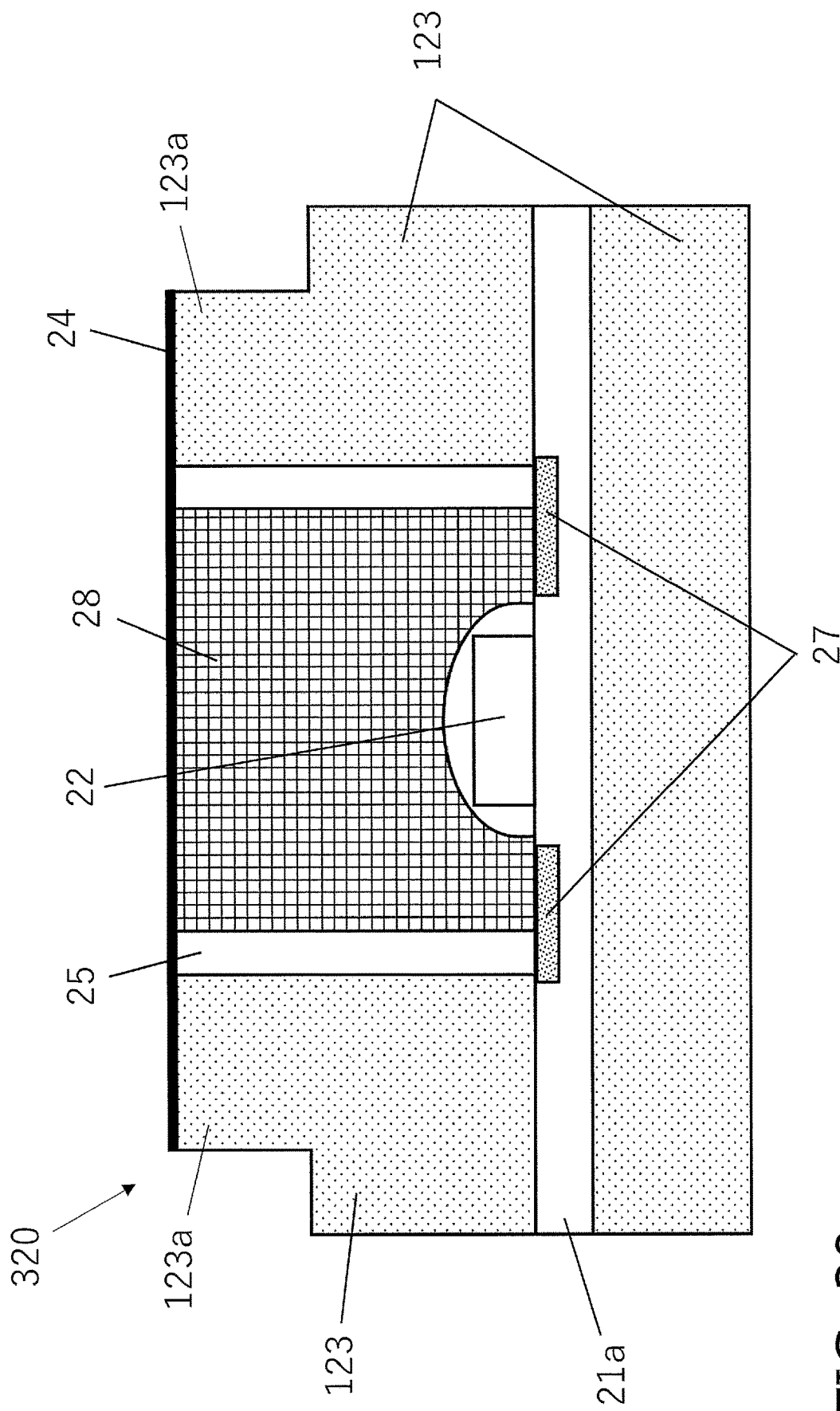
FIG. 20 is a cross-sectional view of the configuration of a modification example of the information display device in FIG. 19.

As shown in FIG. 20, in addition to the configuration shown in FIG. 19, a transmissive material 28 may be disposed in the light guide region 25.

FIG. 20 shows an example in which the transmissive material 28 is disposed between the flexible substrate 21a and the display sheet 24 of the information display device 320.

The electrodes of sensor 27 are in contact with transmissive material 28.

It is possible for the transmissive material 28 to be made of a transparent material, but may be made of a material that transmits a specific proportion of light.

The transmissive material 28 has a dielectric constant higher than that of air, and as shown in FIG. 20, is disposed so that at least a portion thereof is in contact with the flexible substrate 21a. Also, the transmissive material 28 is disposed so that its upper surface is in contact with the display sheet 24.

Thus disposing the transmissive material 28 in the space extending from the flexible substrate 21a to the display sheet 24 in the light guide region 25 makes it easier for the transmissive material 28 to transmit changes in capacitance on the surface of the display sheet 24 to the sensor 27.

Also, the transmissive material 28 is formed from a transparent material. However, the transmissive material 28 need not be transparent, so long as it is a material that transmits a specific proportion of light. Also, the transmissive material 28 is an elastic body, and deforms along with the display sheet 24 to conform to the curved wall surface 30.

The portion of the transmissive material 28 that comes near the light emitter 22 may be disposed with a space therebetween, or may be disposed so that the transmissive material 28 and the light emitter 22 are in contact with each other. The transmissive material 28 and the housing 123 may be disposed with a gap between them, or may be disposed so as to be in contact with each other.

Figure 21:
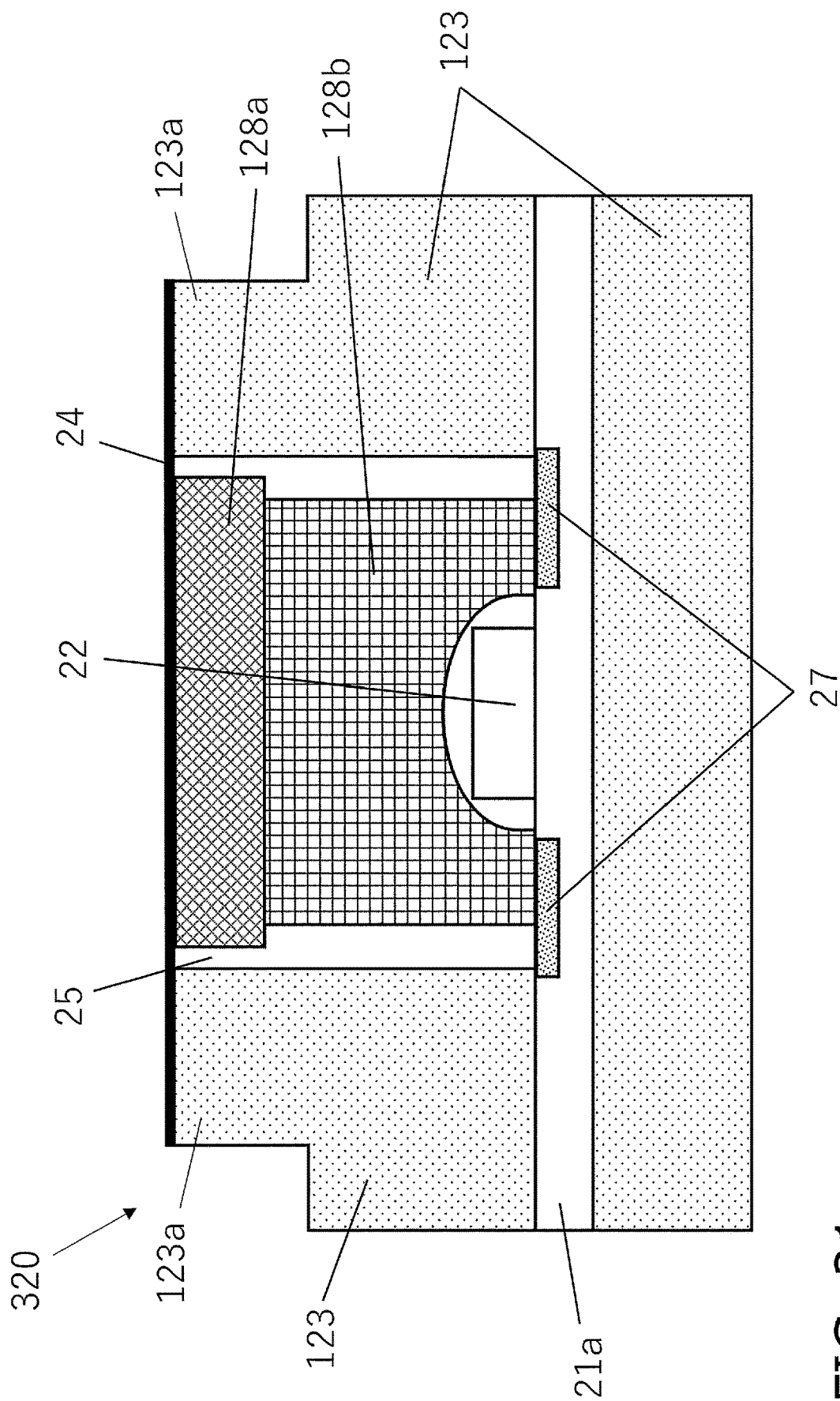
FIG. 21 is a cross-sectional view of the configuration of another modification example of the information display device in FIG. 19.

Also, as shown in FIG. 21, the transmissive material 28 shown in FIG. 20 may have a two-layer structure (transmissive materials 128a and 128b).

The transmissive material (first transmissive material) 128a and the transmissive material (second transmissive material) 128b are disposed in two layers (upper and lower) so as to be in contact with each other, and the transmissive material 128b is disposed in contact with the flexible substrate 21a.

The transmissive material 128a and the display sheet 24 are disposed so as to be in contact with each other in advance, or through deformation of the display sheet 24.

Disposing the transmissive material 128a and the transmissive material 128b in the space between the flexible substrate 21a and the display sheet 24 in the light guide region 25 allows the transmissive material 128a and the transmissive material 128b to efficiently transmit changes in capacitance on the surface of the display sheet 24 to the sensor 27.

The transmissive material 128a and the transmissive material 128b are formed from a transparent material. However, the transmissive materials 128a and 128b need not be transparent, so long as they are made of a material that transmits a specific proportion of light.

Also, the transmissive material 128a is an elastic body, and deforms along with the display sheet 24 to conform to the curved wall surface 30.

The transmissive materials 128a and 128b may entirely be elastic bodies that transmit light. A gap may be formed around the light emitter 22 in the transmissive material 128b, or the transmissive material 128b and the light emitter 22 may be disposed so as to be in contact with each other. The transmissive materials 128a and 128b and the housing 123 may be disposed with a gap between them, or may be disposed so as to be in contact with each other.

Embodiment 5

The information display device 420a according to yet another embodiment of the present disclosure will now be described with reference to FIG. 22.

Figure 22:
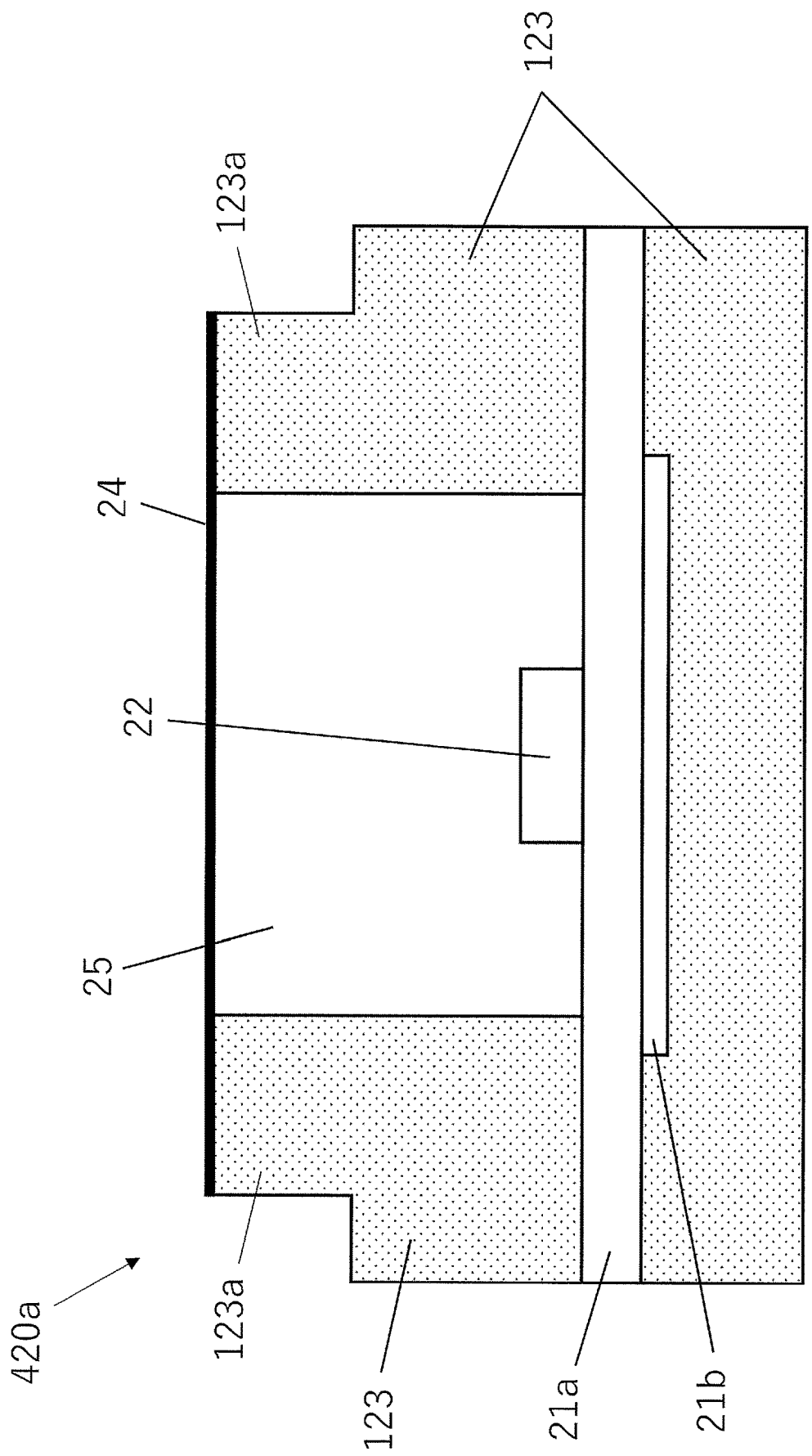
FIG. 22 is a cross-sectional view of the configuration of the information display device according to yet another embodiment of the present disclosure.

As shown in FIG. 22, the information display device 420a of this embodiment differs from Embodiment 2 in that a reinforcing plate (substrate portion) 21b is disposed on the lower surface side of the flexible substrate 21a of Embodiment 2. That is, in this embodiment, the flexible substrate 21a and the reinforcing plate 21b constitute the "substrate portion" of the present disclosure.

However, the configuration other than the above is basically the same as that of Embodiments 1 and 2, so components having the same function and shape as those described in Embodiments 1 and 2 shall be numbered the same and shall not be described in detail again.

As shown in FIG. 22, the information display device 420a of this embodiment has the reinforcing plate 21b disposed on the lower surface side (inside of the wall surface) of the flexible substrate 21a.

As discussed above, the flexible substrate 21a is in the form of a sheet, is flexible, and readily deforms. The flexible substrate 21a is formed by covering a copper foil with a polyimide sheet, for example.

The reinforcing plate 21b is attached to the surface of the flexible substrate 21a on the opposite side from the surface on which the light emitter 22 is disposed.

At least the portion of the housing 123 in contact with the display sheet 24 is made of a material that is softer than the flexible substrate 21a reinforced by the reinforcing plate 21b. That is, the portion of the housing 123 in contact with the display sheet 24 is configured to deform more readily in a direction intersecting the surface of the display sheet 24 than the flexible substrate 21a reinforced by the reinforcing plate 21b. For instance, the reinforcing plate 21b is molded from an epoxy resin, but is not limited to this configuration and may be molded from a material that is harder than the flexible substrate 21a, such as other resins or metals.

Providing the reinforcing plate 21b makes the information display device 420a less likely to bend in a direction intersecting the surface of the display sheet 24 than the connecting portion where adjacent information display devices 420a are connected.

Also, providing the reinforcing plate 21b increases the strength of the portion of the flexible substrate 21a where the light emitter 22 is disposed. Consequently, when the information display device 420a is being manufactured, or when it is handled in order to fit it to the wall surface, etc., there will be less deformation around the soldered portion for installing electronic components such as the light emitters 22 on the reinforcing plate 21b. Accordingly, the soldered portion will be subjected to less stress.

Figure 23:
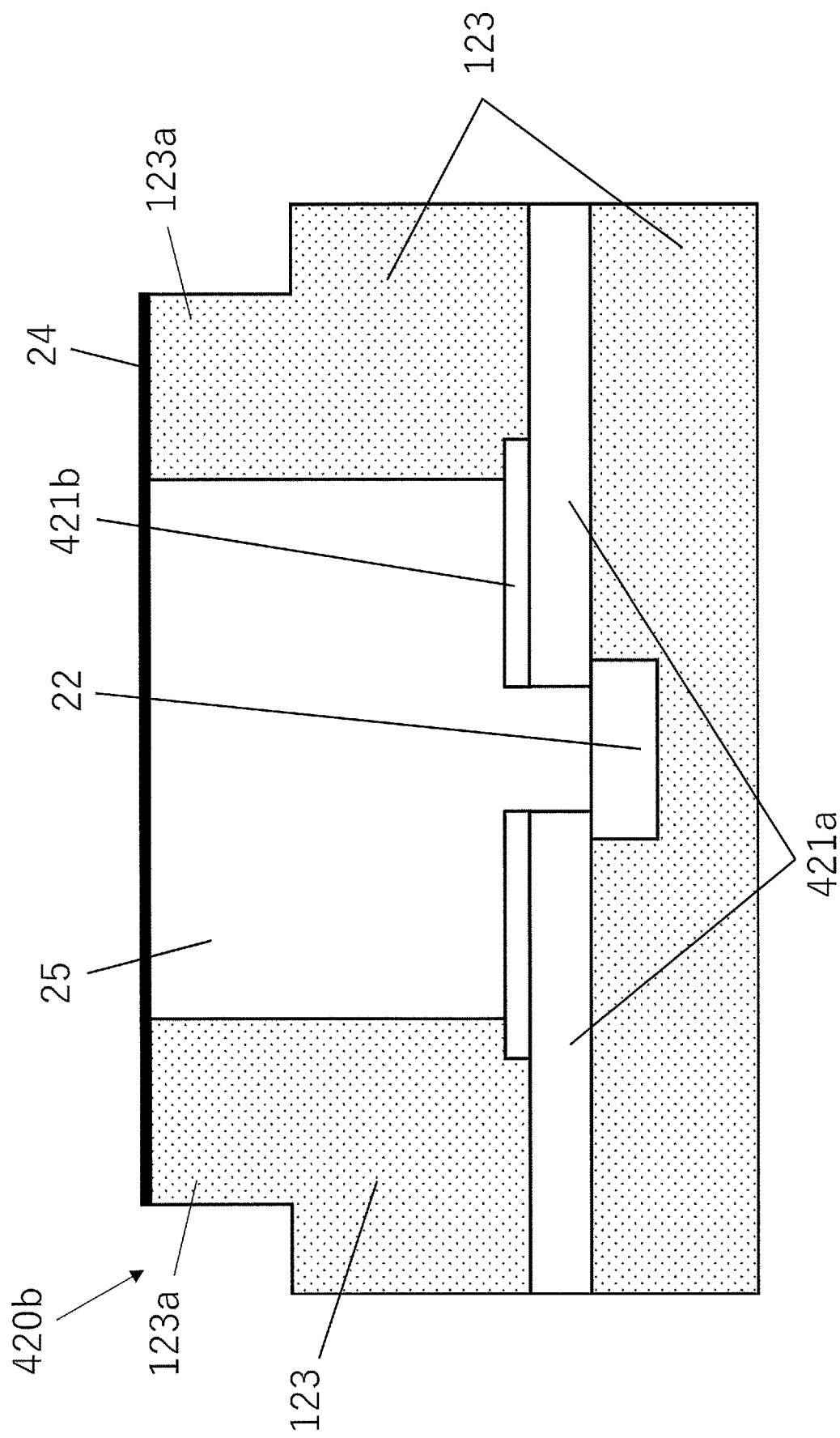
FIG. 23 is a cross-sectional view of the configuration of a modification example of the information display device in FIG. 22.

As shown in FIG. 23, the information display device 420b may be such that the light emitter 22 is disposed on the lower surface side of the flexible substrate 21a and emits light to the display sheet 24 side via a through-hole formed in the flexible substrate 421a, and the reinforcing plate 421b is disposed on the upper surface of the flexible substrate 421a.

The light emitters 22 are disposed on the surface of the flexible substrate 421a on the opposite side from the display sheet 24.

The reinforcing plate 421b is attached to the surface of the flexible substrate 421a on the opposite side from the surface on which the light emitters 22 are disposed.

At least the portion of the housing 123 that is in contact with the display sheet 24 is softer than the reinforcing plate 421b. That is, the portion of the housing 123 in contact with the display sheet 24 deforms more readily in a direction intersecting the surface of the display sheet 24 than does the reinforcing plate 421b.

As shown in FIG. 23, through-holes that are smaller than the light emitters 22 are formed in the flexible substrate 421a and the reinforcing plate 421b, and these through-holes are also included in the light guide region.

Embodiment 6

The information display device 520 according to yet another embodiment of the present disclosure will now be described with reference to FIG. 24.

Figure 24:
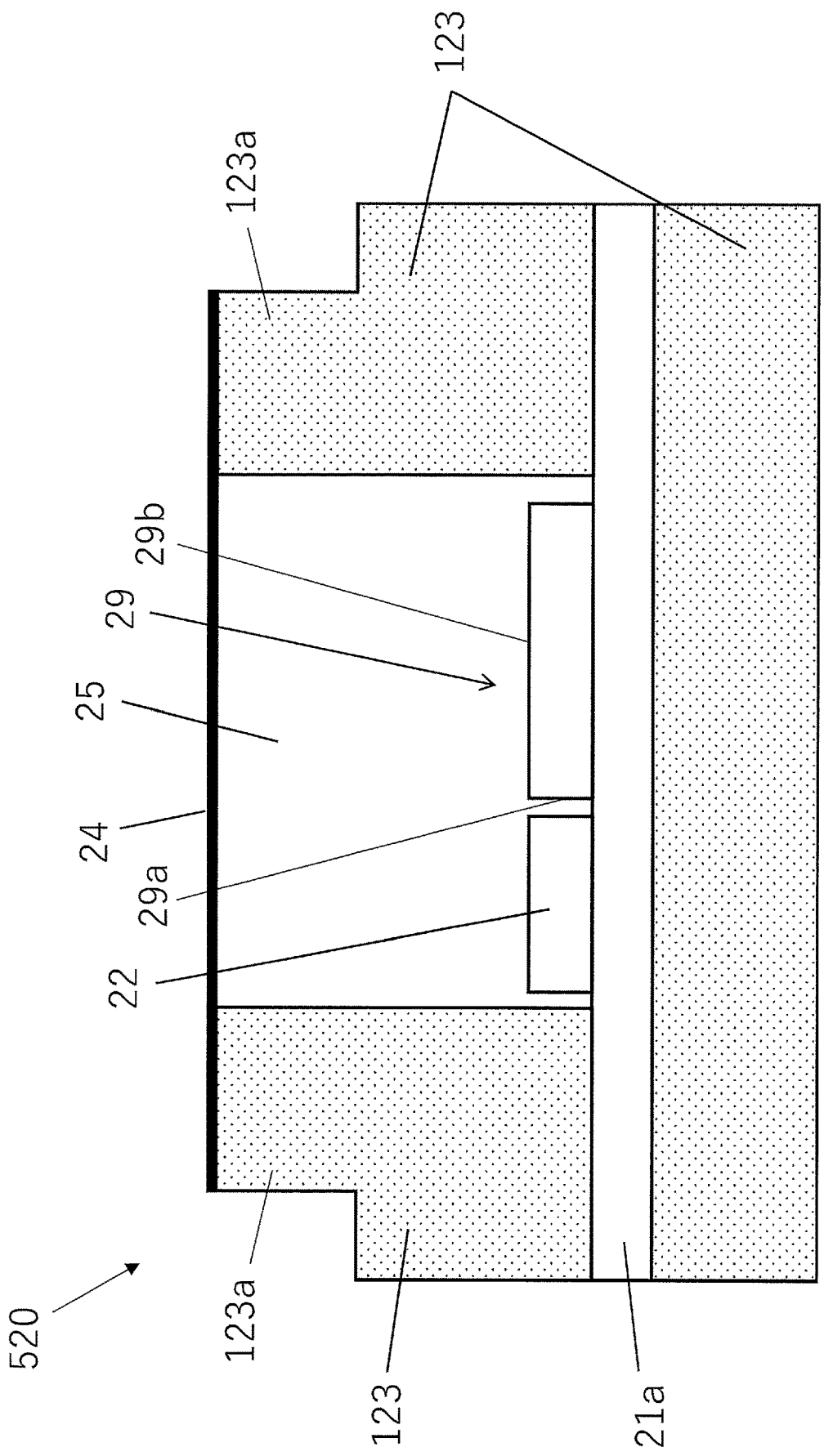
FIG. 24 is a cross-sectional view of the configuration of the information display device according to yet another embodiment of the present disclosure.

As shown in FIG. 24, the information display device 520 of this embodiment differs from Embodiment 2 in that a light guide body 29 is disposed in the vicinity of the light emitter 22 on the flexible substrate 21a of Embodiment 2.

However, the configuration other than the above is basically the same as that of Embodiments 1 and 2, so components having the same function and shape as those described in Embodiments 1 and 2 shall be numbered the same and shall not be described in detail again.

As shown in FIG. 24, the information display device 520 of this embodiment has the light guide body 29 at a position adjacent to the light emitter 22 on the flexible substrate 21a.

The light guide body 29 diffuses, condenses, or reflects the light emitted from the light emitter 22 in the desired direction.

More precisely, the light guide body 29 has an incident surface 29a on which the light emitted from the light emitter 22 is incident, and an exit surface 29b from which the light incident from the incident surface 29a is emitted toward the display sheet 24.

The incident surface 29a is the end surface of the light guide body 29 opposite the light emitter 22, and the exit surface 29b is the surface of the light guide body 29 opposite the display sheet 24.

As a result, the light from the light emitter 22 is diffused by the light guide body 29, so the intensity of the light in the direction of the display sheet 24 is more uniform. Also, since the light can be condensed in the intended direction by the light guide body 29, the intensity of the light can be adjusted.

Also, when the light emitter 22 emits light substantially parallel to the flexible substrate 21a, the light guide body 29 can reflect that light toward the display sheet 24.

Embodiment 7

The information display device 620a according to yet another embodiment of the present disclosure will now be described with reference to FIG. 25.

Figure 25:
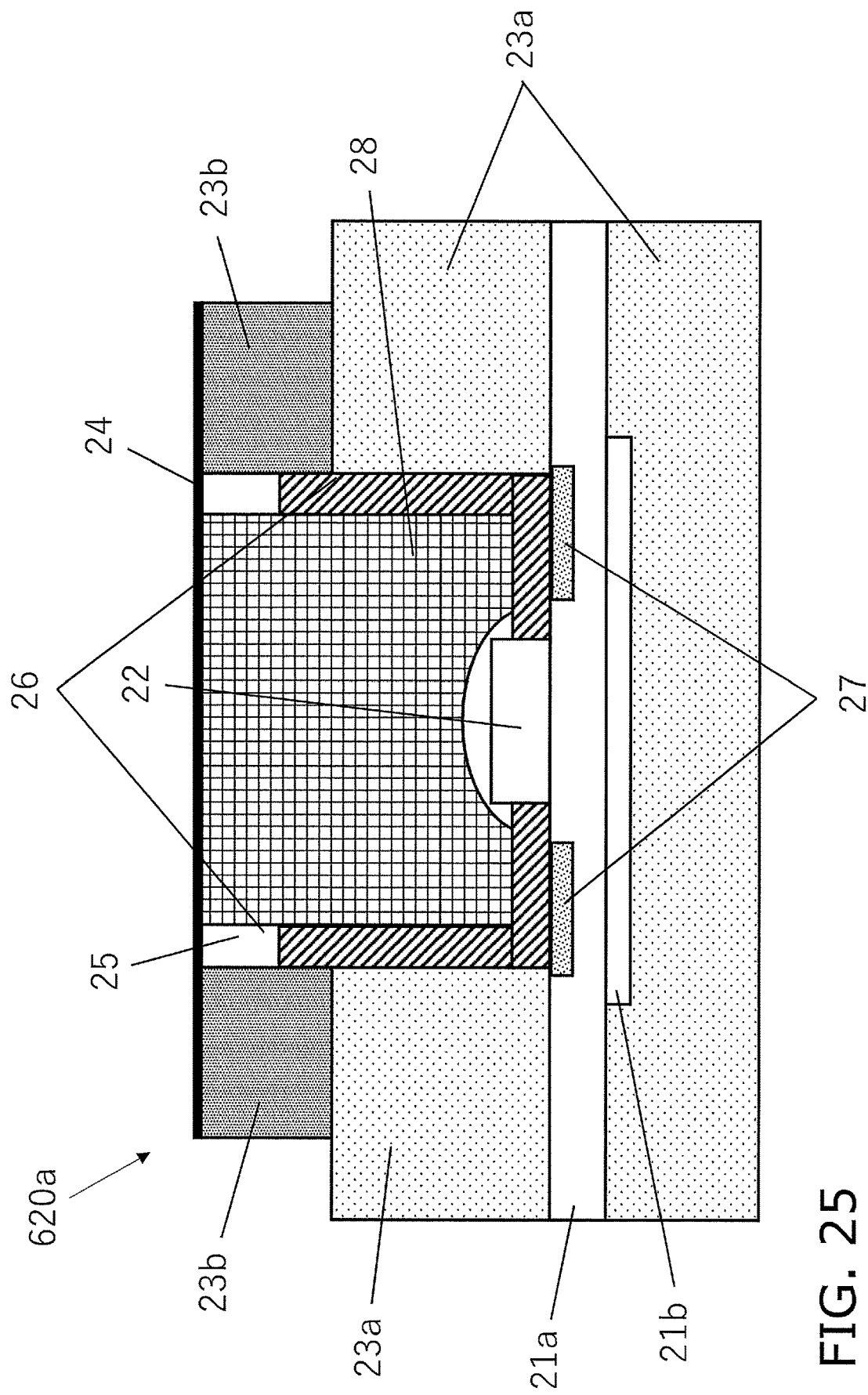
FIG. 25 is a cross-sectional view of the configuration of the information display device according to yet another embodiment of the present disclosure.

As shown in FIG. 25, the information display device 620a of this embodiment differs from Embodiment 1 in that the sensor 27 is disposed on the flexible substrate 21a of Embodiment 1, the reinforcing plate 21b is provided on the lower surface side of the flexible substrate 21a, and the transmissive material 28 is provided in the light guide region 25.

However, the configuration other than the above is basically the same as that of Embodiment 1, so components having the same function and shape as those described in Embodiment 1 shall be numbered the same and shall not be described in detail again.

In the information display device 620a of this embodiment, as shown in FIG. 25, the sensor 27 provided on the flexible substrate 21a senses changes in capacitance on the surface of the display sheet 24 via the transmissive material 28, and is thus able to efficiently detect an operation made by the finger of a passenger or other such user.

In the light guide region 25, the light emitter 22 is surrounded by the reflective material 26, so the light is reflected and diffused in the light guide region 25 inside the first housing 23a and the second housing 23b, which improves uniformity of the intensity of the light that is incident on the display sheet 24.

This allows an image with high uniformity of light to be displayed on the wall surface.

Furthermore, the reinforcing plate 21b is attached to the surface of the flexible substrate 21a on the opposite side from the surface on which the light emitter 22 is disposed.

Consequently, the strength of the part of the flexible substrate 21a on which the light emitter 22 is disposed can be increased.

Figure 26:
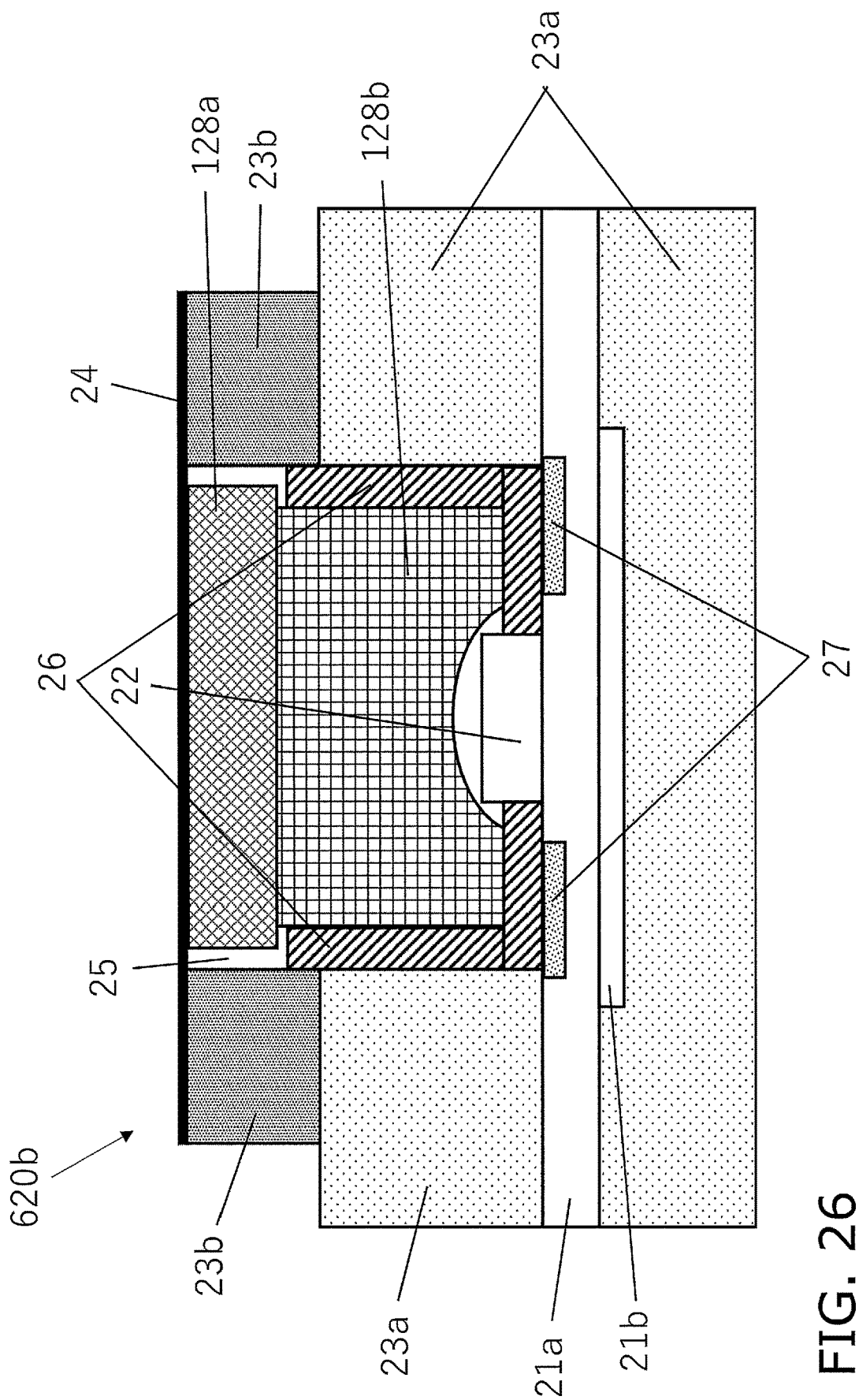
FIG. 26 is a cross-sectional view of the configuration of a modification example of the information display device in FIG. 25.

As shown in FIG. 26, in the configuration shown in FIG. 25, the transmissive material 28 may be divided into transmissive materials 128a and 128b (information display device 620b).

Embodiment 8

The information terminal 710 according to yet another embodiment of the present disclosure will now be described with reference to FIGS. 27 to 30.

Figure 27:
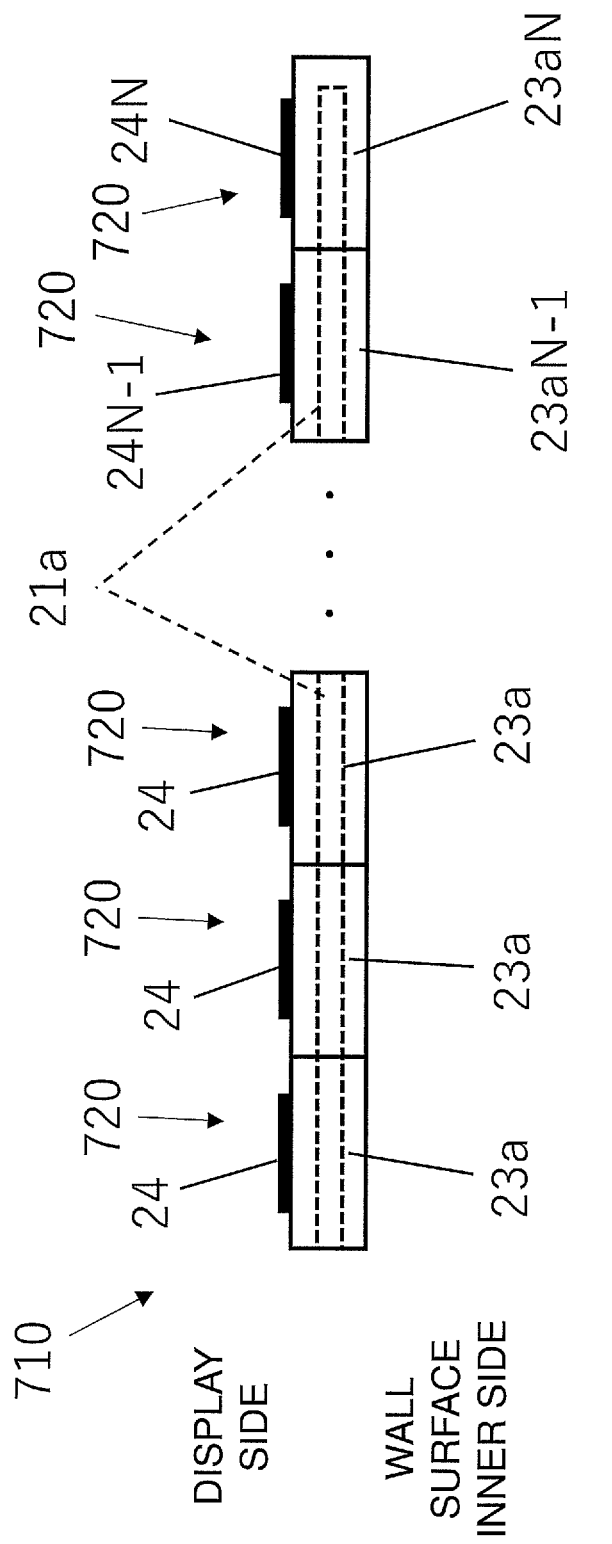
FIG. 27 is a cross-sectional view of the configuration of the information terminal according to yet another embodiment of the present disclosure.
Figure 28:
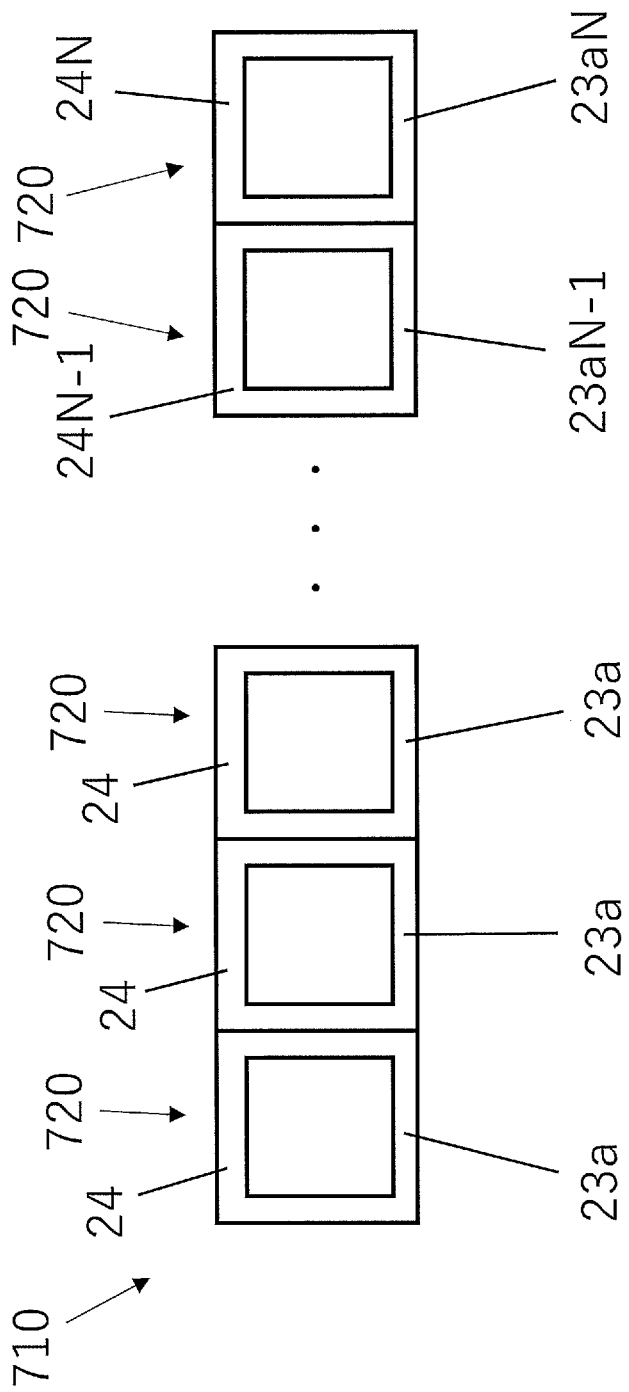
FIG. 28 is a top view of the information terminal in FIG. 27 as viewed from the display side.

As shown in FIGS. 27 and 28, the information terminal 710 of this embodiment differs from Embodiment 1 in that the case 23e and the control board 21c of Embodiment 1 are not provided.

However, the configuration other than the above is basically the same as that of Embodiment 1, so components having the same function and shape as those described in Embodiment 1 shall be numbered the same and shall not be described in detail again.

In the information terminal 710 of this embodiment, a plurality of information display devices 720 are lined up so that the display sheets 24 are all facing in the same direction. As shown in FIGS. 27 and 28, just as in the Embodiment 1, the information terminal 710 has a plurality of information display devices 720 linked in the first housing 23a portion.

The first housing 23a is formed from an elastic material, and is softly deformed at the connecting portion between the information display devices 720.

Consequently, the information display devices 720 can bend at the connecting portions. The flexible substrate 21a can be used as the substrate of the information terminal 710.

Also, the grooves 23c and 23d are provided to the first housing 23a, as discussed above, at the connecting portions of the information display devices 720 adjacent to each other.

Figure 29:
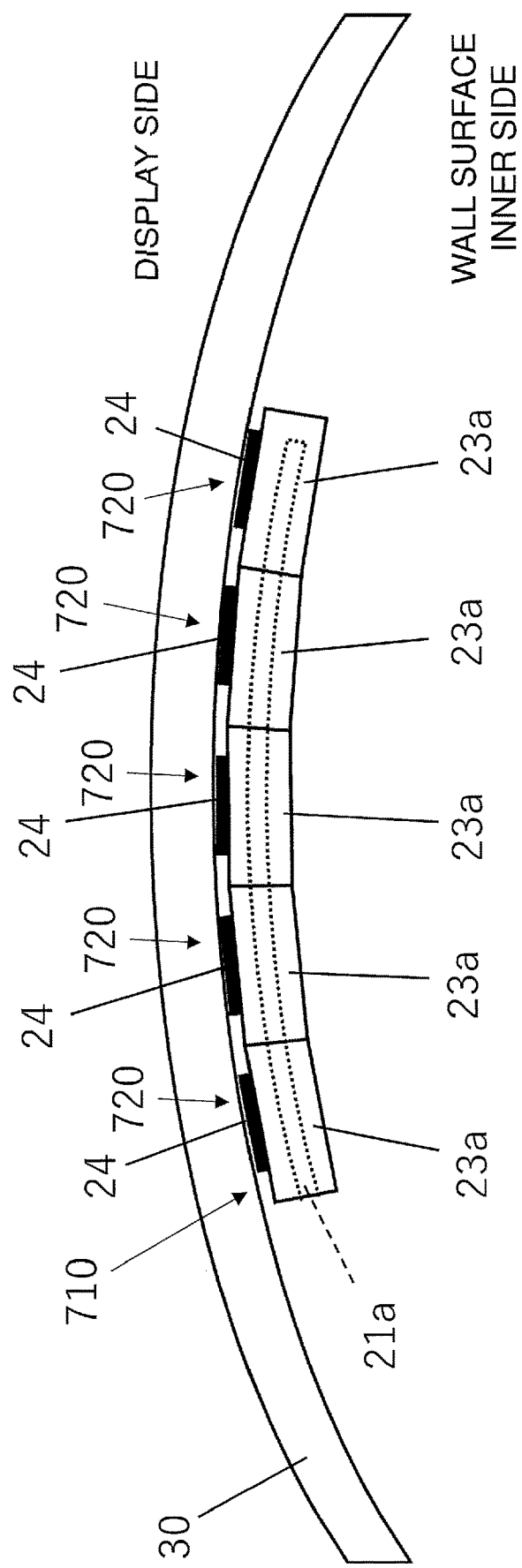
FIG. 29 is a cross-sectional view showing a state in which the information terminal in FIG. 27 is disposed on a curved wall with a convex shape.
Figure 30:
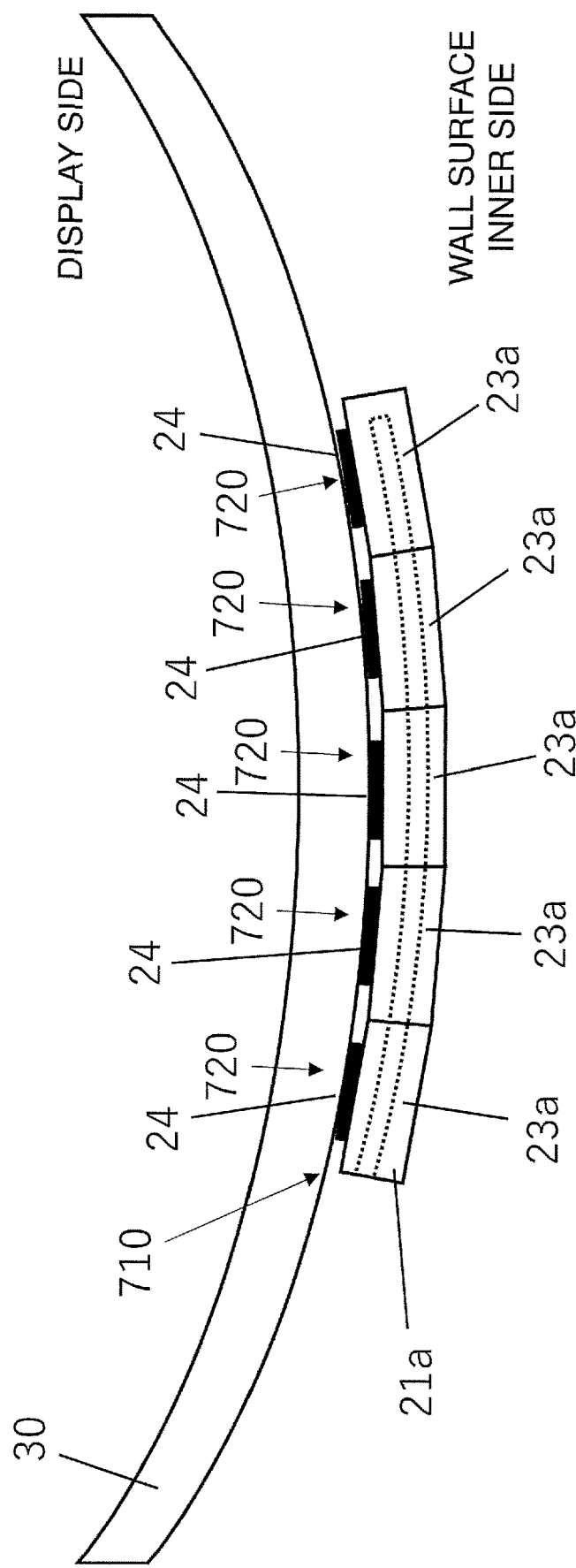
FIG. 30 is a cross-sectional view showing a state in which the information terminal in FIG. 27 is disposed on a curved wall with a concave shape.

This allows the first housing 23a to flexibly deform along the curved wall surface 30 at the connecting portions of the plurality of information display devices 720, as shown in FIGS. 29 and 30.

Appendix

In the configuration of the present disclosure, the display sheet may have a sensor that detects that the display sheet has been touched by the user.

In the configuration of the present disclosure, the light guide may be disposed on the upper surface of the substrate along with the light emitters.

In the configuration of the present disclosure, the light guide may have an incident surface on which light emitted from the light emitters is incident, and an exit surface from which the light incident from the incident surface is emitted toward the display sheet.

In the configuration of the present disclosure, the incident surface may be the end surface of the light guide that is opposite the light emitter, and the exit surface may be the surface of the light guide that is opposite the display sheet.

In the configuration of the present disclosure, the first grooves and the second grooves may be disposed at positions that are offset from each other on the front and back surfaces of the housing.

In the configuration of the present disclosure, the display sheet may have a substrate that transmits light and a light blocking layer that partially transmits light from the light emitter.

In the configuration of the present disclosure, the display sheet may further have a colored layer that is provided between the substrate and the light blocking layer and transmits a specific proportion of light.

In the configuration of the present disclosure, the display sheet may further have a diffusion layer that transmits a specific proportion of light from the light emitter and reflects and diffuses the light from the light emitter into the light guide region.

Other Embodiments

Embodiments were described above as examples of the technology of the present disclosure, but the disclosure is not limited to or by these, and can also be applied to embodiments in which changes, replacements, additions, omissions, etc., have been made. Also, it is also possible to combine the constituent elements described in the above embodiments to form new embodiments.

(A)

Figure 31:
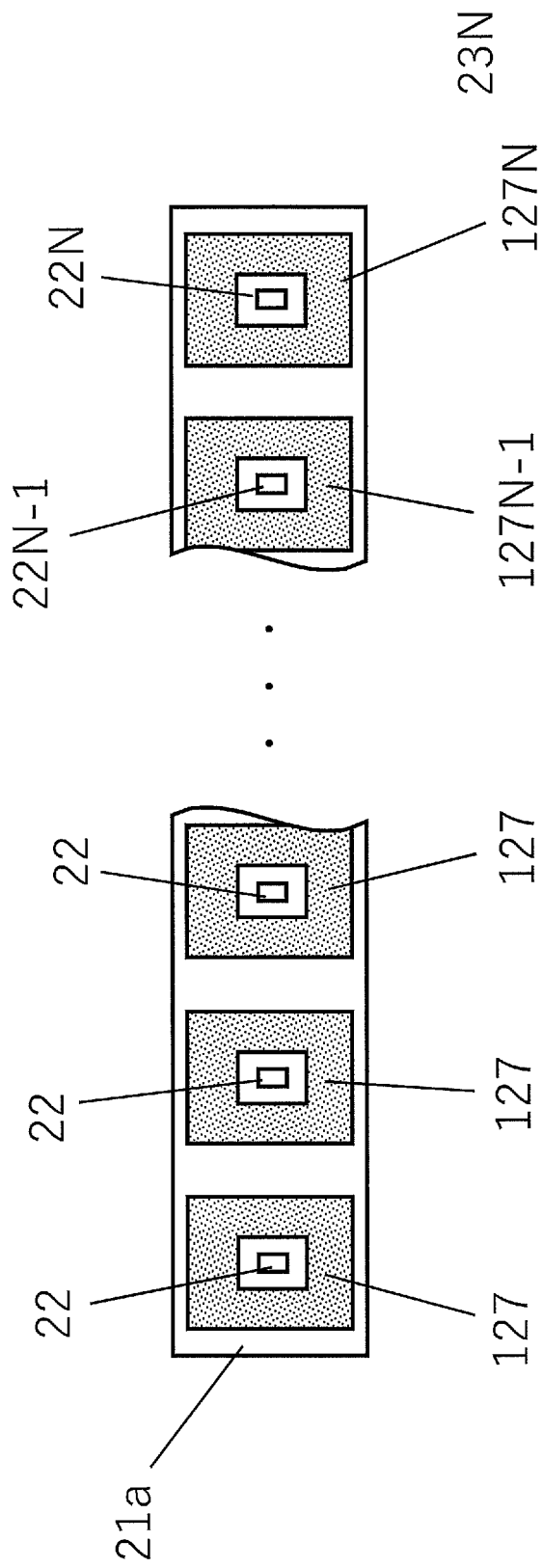
FIG. 31 is a cross-sectional view of the main configuration of the information display device according to yet another embodiment of the present disclosure.

For instance, FIG. 31 shows an example of the shape of the electrodes of the sensors 127 disposed on the flexible substrate 21a in Embodiment 1.

The sensors 127 are disposed so as to surround the light emitters 22 on the flexible substrate 21a. The sensors 127 are disposed around the light emitters 22 corresponding to the various information display devices 120 on the flexible substrate 21a, and sense the change in capacitance accompanying an operation made by a human finger or the like near the surface of the display sheet 24.

This makes it possible to effectively detect an operation with a human finger or the like around each display sheet 24. The shape of the electrodes of the sensors 127 may be either hollow in the center or solid, and may be either rectangular or circular.

(B)

Figure 32:
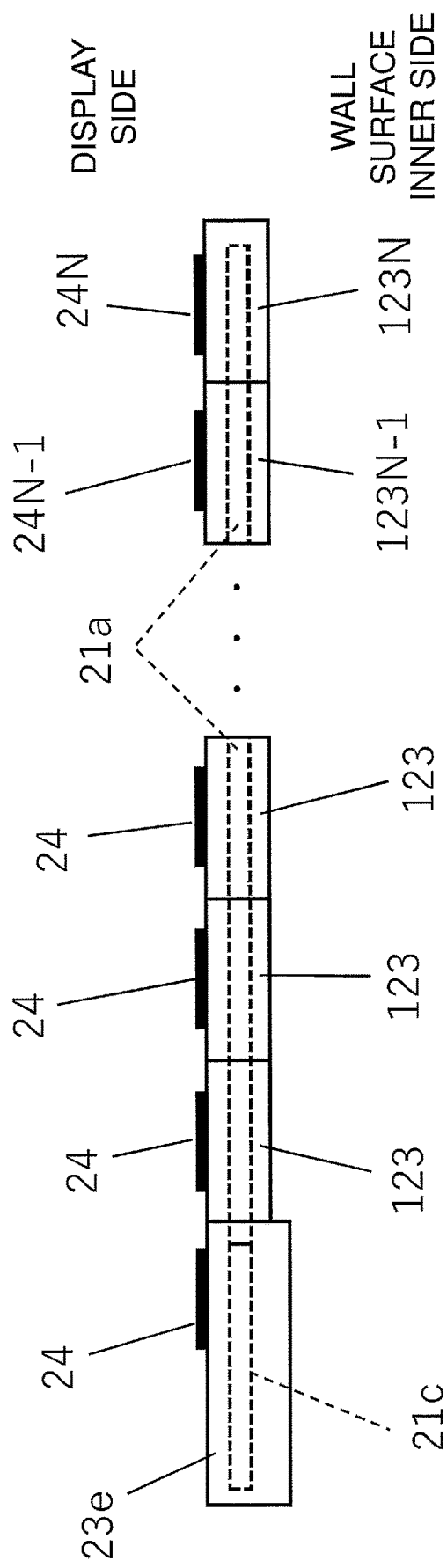
FIG. 32 is a side view of the configuration of the information terminal according to yet another embodiment of the present disclosure.
Figure 33:
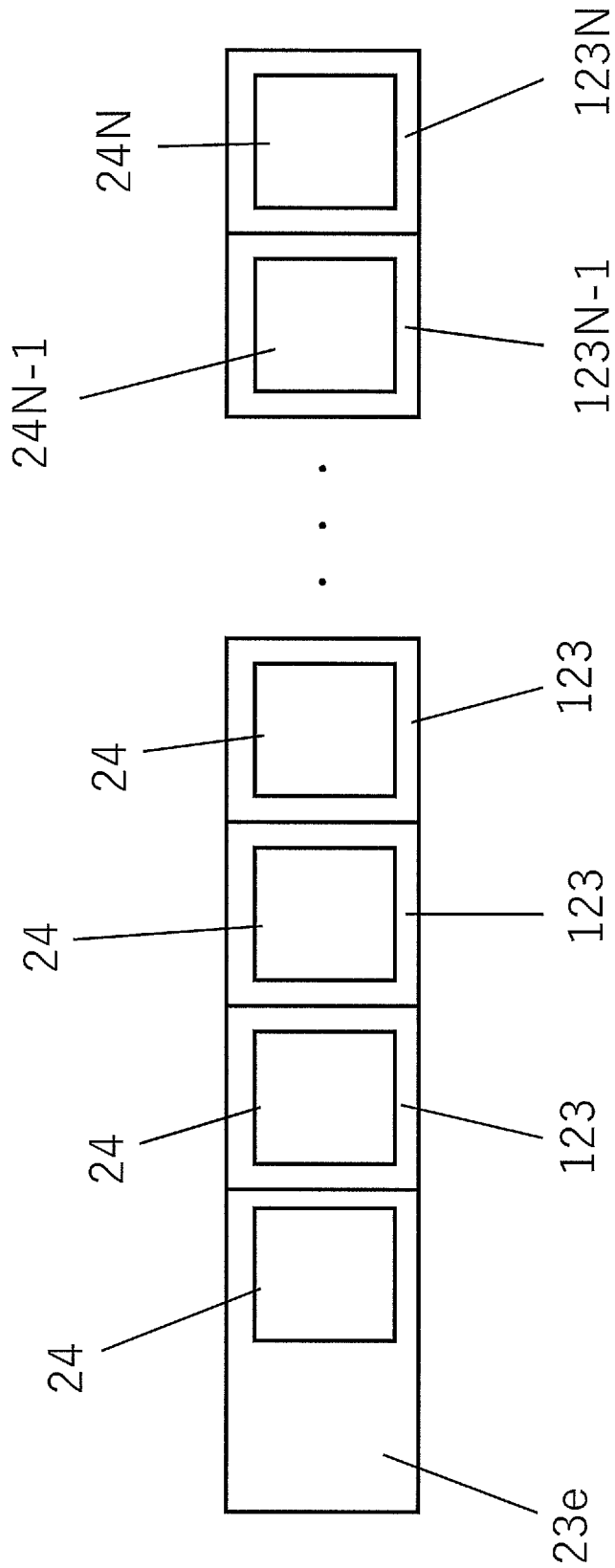
FIG. 33 is a top view of the information terminal in FIG. 32 as viewed from the display side.

For example, as shown in FIGS. 32 and 33, the display sheet 24 may also be provided to the case 23e.

Figure 34:
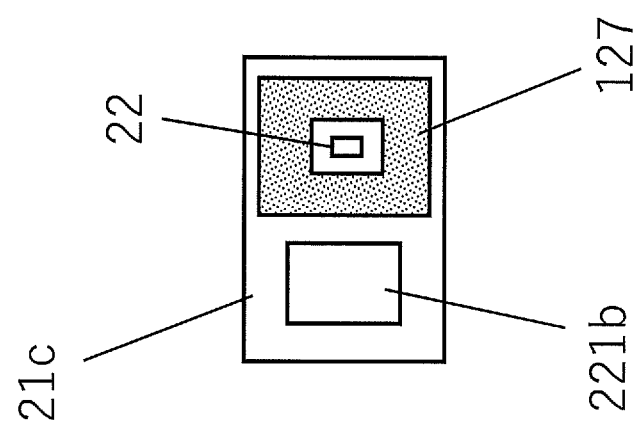
FIG. 34 is a top view of the configuration on a control board included in the information terminal in FIG. 32 as viewed from the display side.

In this case, as shown in FIG. 34, the light emitters 22 and the sensors 127 are provided on the control board 21c along with the control circuit 221b.

Figure 35:
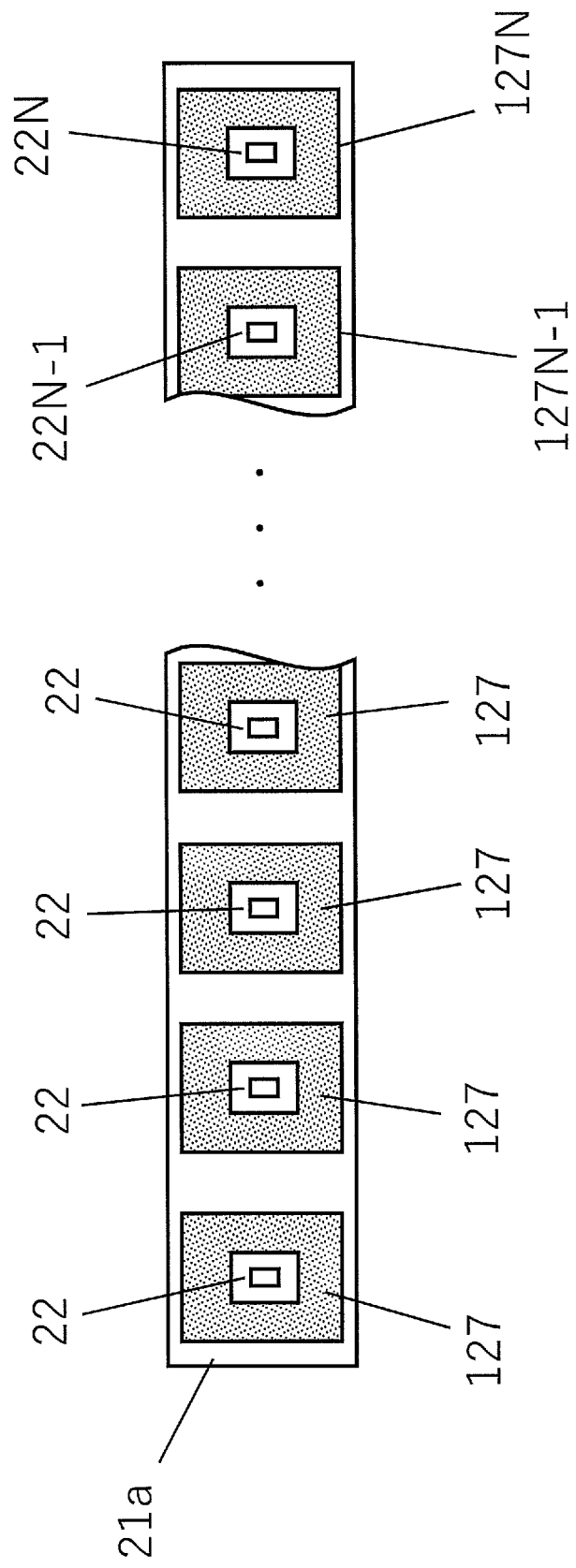
FIG. 35 is a top view of the configuration on the flexible substrate included in the information terminal in FIG. 32 as viewed from the display side.

Similarly, as shown in FIG. 35, light emitters 22 and sensors 127 are provided on flexible substrate 21a at positions corresponding to the plurality of information display devices.

This allows the desired pattern to be displayed on the wall surface 30 via the display sheet 24 also in the case 21e containing the control board 21c.

(C)

Figure 36:
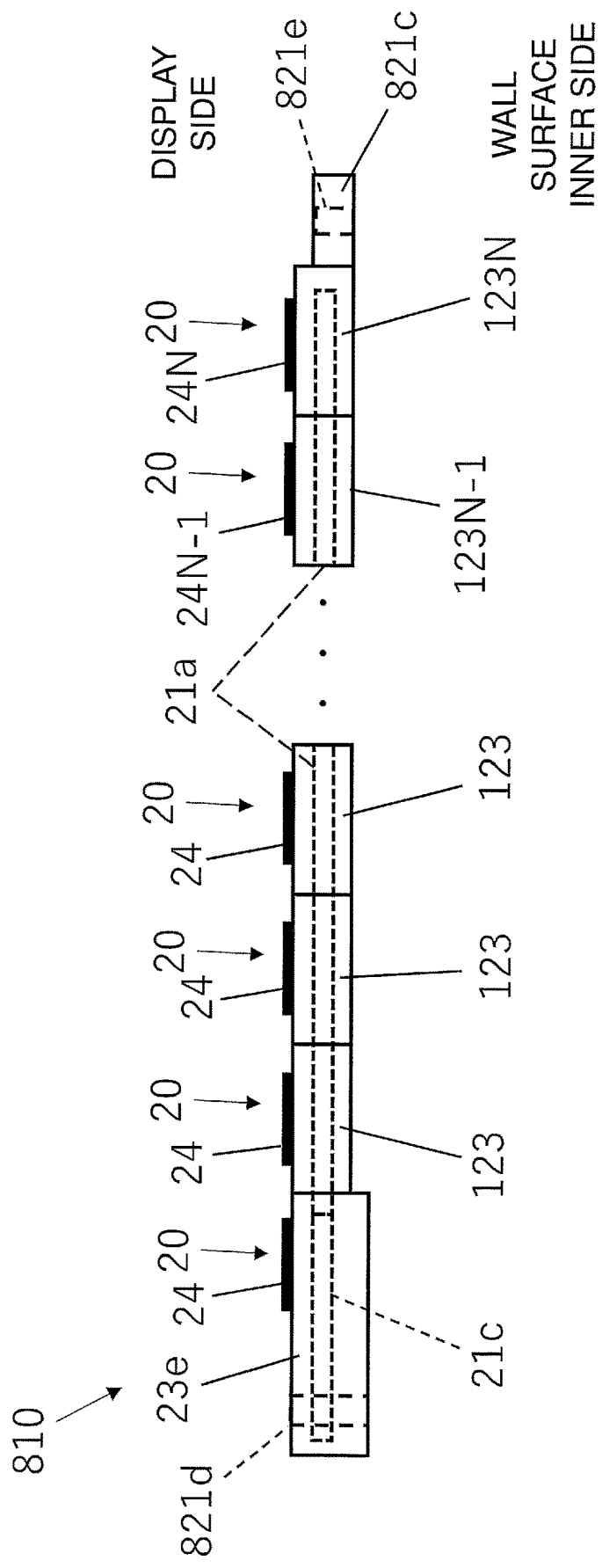
FIG. 36 is a cross-sectional view of the configuration of the information terminal according to yet another embodiment of the present disclosure.
Figure 37:
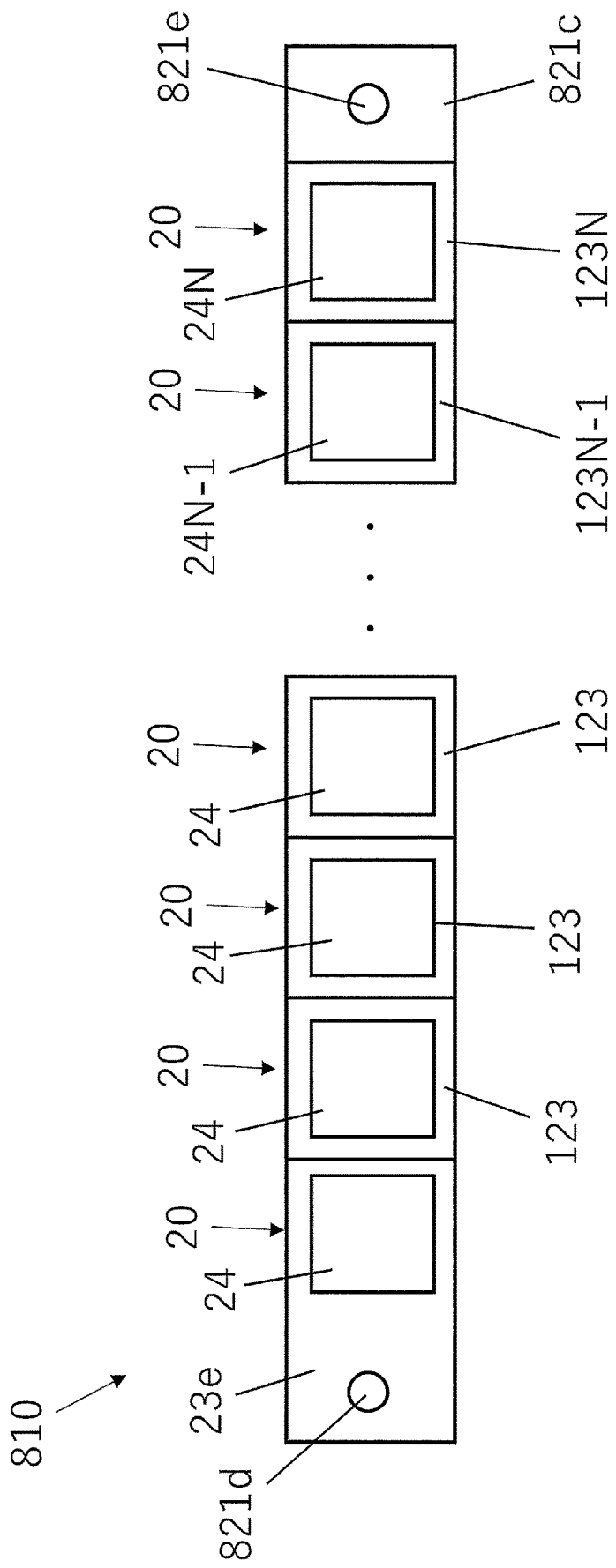
FIG. 37 is a top view of the information terminal in FIG. 36 as viewed from the display side.

For example, as shown in FIGS. 36 and 37, mounting holes 821d and 821e for mounting the information terminal 810 to the wall surface 30 or the like may be provided at the two ends (case 23e, end 821c) in the lengthwise direction.

Consequently, the information terminal 810 is attached to another structure such as the wall surface 30 with screws or other such fastening members inserted into the attachment holes 821d and 821e.

The information terminal 810 can be attached and fixed by threading male screws into female threads provided on the structure side.

(D)

Figure 38:
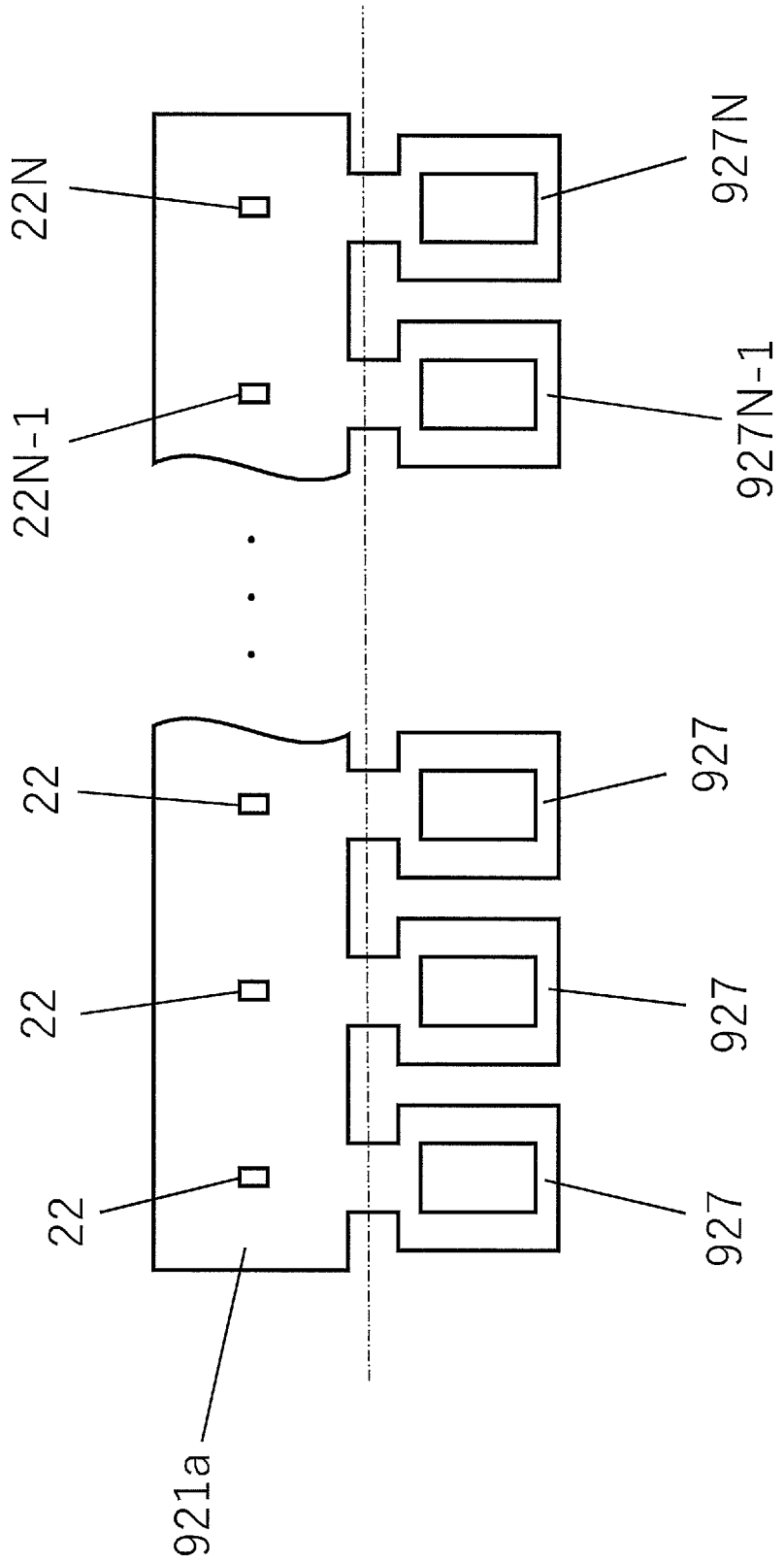
FIG. 38 is a plan view of the configuration of the information terminal according to yet another embodiment of the present disclosure.

For example, as shown in FIG. 38, light emitters 22 may be provided at positions corresponding to a plurality of information display devices on the flexible substrate 921a, and sensors 927 corresponding to the light emitters 22 may be provided in a direction perpendicular to the lengthwise direction of the flexible substrate 921a.

The sensors 927 are disposed near the display sheet 24 by being folded back at the connecting portion with the flexible substrate 921a (indicated by a one-dot chain line in the drawing) and disposed overlapping the flexible substrate 921a. Because the sensors 927 have a hollow shape, the light emitted from the light emitters 22 is able to pass through to the display sheet 24.

The hollow shape may be rectangular or circular. The sensors 927 may have a sheet-like shape without any hole, rather than a hollow shape, if a material that transmits a specific proportion of light is used.

(E)

Figure 39:
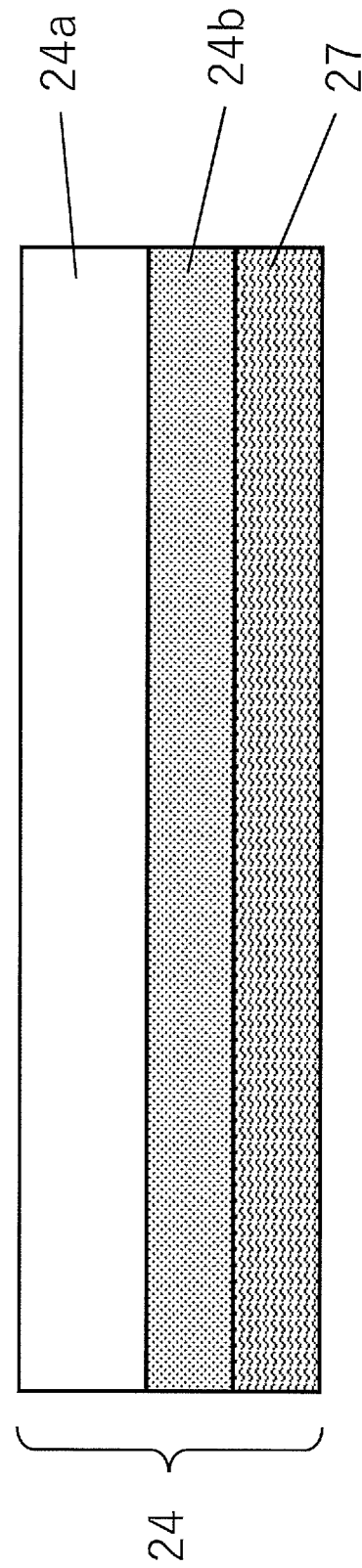
FIG. 39 is a cross-sectional view of the configuration of the display sheet included in the information display device according to yet another embodiment of the present disclosure.

For example, as shown in FIG. 39, the sensor 27 may be disposed on the display sheet 24 included in the information display device.

FIG. 39 shows a configuration in which a sensor 27 is disposed as one of the layers constituting the display sheet 24 of the information terminal 10.

Consequently, since there is no space between the wall surface 30, the display sheet 24, and the sensor 27, an operation of a passenger or other person's finger near the surface of the display sheet 24 can be sensed more accurately.

Also, configuring the sensor 27 as a part of the display sheet 24 allows the sensor 27 to substitute for the display sheet 24.

(F)

In the above embodiment, as shown in FIG. 5, etc., an example was given in which the grooves 23c and 23d were provided at positions that were offset from each other on the front and rear surfaces of the connecting portion of the first housing 23a of the information display device 20. However, the present disclosure is not limited to this.

For instance, the grooves formed in the first housing may be provided on just the front surface or the rear surface.

Also, the grooves provided on the front and back surfaces may be provided at positions that are opposite each other.

(G)

In the above embodiment, an example was given in which the grooves 23c and 23d provided to the connecting portions of the first housing 23a connecting a plurality of information display devices made it easier for the connecting portions to bend along the wall surface. However, the present disclosure is not limited to this.

For instance, the configuration for making the connecting portions more bendable may be one in which the wall thickness is reduced, one in which the portion is made from a softer material, one in which something other than grooves is used, or a configuration combining these.

Also, the connecting portion may be provided as a separate member rather than being integrated with the housing.

Also, although an example of using a flexible substrate as the substrate portion was given, some other substrate such as a rigid substrate or a metal-based substrate may be used. For example, the configuration may be such that rigid substrates provided to adjacent information display devices are linked by cables provided to the connecting portions. The connecting portions should be configured to bend more easily than the information display devices, and this is not the only example of using a substrate different from a flexible substrate for the substrate portion.

The invention claimed is:

1. An information display device, comprising:
   a substrate portion;
   a light emitter that is disposed on the substrate portion and is configured to emit light;
   a housing that is disposed so as to cover the substrate portion;
   a display sheet that is attached to the housing, has a display surface on which various kinds of information are displayed by light emitted from the light emitter, and whose display surface is deformable; and
   a light guide region, which is a space formed by an inner wall surface of the housing and the display sheet, and guides the light emitted from the light emitter to the display sheet,
   wherein the housing has a deformable portion that is provided to at least a portion in contact with the display sheet, and that is more readily deformable than the substrate portion in a direction intersecting a surface of the display sheet, and
   the housing and the display sheet deform along a wall surface with which the display sheet comes into contact, and
   a distance from the substrate portion to the display sheet in a direction intersecting the surface of the display sheet is greater than a distance from the substrate portion to an end of the light emitter.

2. The information display device according to claim 1, wherein the housing has a first housing, and a second housing that is provided so as to be in contact with the display sheet and is formed from a material softer than the first housing.

3. The information display device according to claim 1, wherein the substrate portion includes a sheet-like flexible substrate having a flexibility and a reinforcing plate that reinforces the flexible substrate, and
   at least the portion of the housing that is in contact with the display sheet deforms in a direction intersecting the surface of the display sheet more readily than the reinforcing plate.

4. An information terminal, comprising:
the information display device according to claim 1, a plurality of which are connected so as to be disposed in a same direction when viewed from the substrate portion; and
connecting portions that connect the plurality of information display devices.

5. The information terminal according to claim 4, wherein the connecting portions between the adjacent information display devices are connected to each other in a state in which they are bendable in a direction intersecting the surface of the display sheet more readily than the information display devices.

6. The information terminal according to claim 4, wherein the connecting portions each have a groove that bends the plurality of connected information display devices in the direction of intersecting the surface of the display sheet.

7. The information display device according to claim 1, further comprising a reflective material that is provided along at least the housing or the substrate portion inside the light guide region, and reflects light.

8. The information display device according to claim 1, wherein the information display device has a sensor that detects contact with the wall surface by a user or a change in capacitance near the display sheet.

9. The information display device according to claim 8, further comprising a transmissive material that is configured to be in contact with at least the sensor in the light guide region, allows light from the light emitter to pass through, and transmits a change in capacitance caused by contact with the display sheet by a user to the sensor.

10. The information display device according to claim 9, wherein the transmissive material has a first transmissive material and a second transmissive material,
the first transmissive material is in contact with the second transmissive material and deforms along with the display sheet while touching the display sheet upon a deformation of at least the display sheet,
the second transmissive material is in contact with the first transmissive material and the substrate portion, and
the first transmissive material and the second transmissive material each transmit light from the light emitter and guide this light to the display sheet.

11. The information display device according to claim 1, further having a light guide that is disposed on a surface of the substrate portion and is configured to guide light from the light emitter to the display sheet.

\* \* \* \* \*